(12) United States Patent
Kim et al.

(10) Patent No.: US 12,268,022 B2
(45) Date of Patent: Apr. 1, 2025

(54) SEMICONDUCTOR DEVICE INCLUDING AIR GAP REGIONS BELOW SOURCE/DRAIN REGIONS

(71) Applicant: SAMSUNG ELECTRONICS CO., LTD., Suwon-si (KR)

(72) Inventors: Jinbum Kim, Seoul (KR); Dahye Kim, Seoul (KR); Dongmyoung Kim, Suwon-si (KR); Dongwoo Kim, Incheon (KR); Yongjun Nam, Hwaseong-si (KR); Sangmoon Lee, Suwon-si (KR); Ingyu Jang, Seoul (KR); Sujin Jung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 429 days.

(21) Appl. No.: 17/714,695

(22) Filed: Apr. 6, 2022

(65) Prior Publication Data

US 2022/0352309 A1 Nov. 3, 2022

(30) Foreign Application Priority Data

May 3, 2021 (KR) .................. 10-2021-0057363

(51) Int. Cl.
*H10D 62/10* (2025.01)
*H10D 62/13* (2025.01)
*H10D 62/17* (2025.01)

(52) U.S. Cl.
CPC ......... *H10D 62/116* (2025.01); *H10D 62/151* (2025.01); *H10D 62/235* (2025.01)

(58) Field of Classification Search
None
See application file for complete search history.

(56) References Cited

U.S. PATENT DOCUMENTS

| | | |
|---|---|---|
| 9,984,936 B1 | 5/2018 | Xie et al. |
| 10,128,379 B2 | 11/2018 | Song et al. |
| 10,461,195 B2 | 10/2019 | Kwon et al. |
| 10,840,329 B1 | 11/2020 | Xie et al. |
| 2020/0343373 A1 | 10/2020 | Tsai et al. |
| 2020/0365586 A1* | 11/2020 | Shin ................. H01L 27/0886 |
| 2020/0365692 A1 | 11/2020 | Jung et al. |
| 2020/0395445 A1 | 12/2020 | Choi et al. |

* cited by examiner

*Primary Examiner* — Daniel Whalen
(74) *Attorney, Agent, or Firm* — Fish & Richardson P.C.

(57) ABSTRACT

A semiconductor device includes a substrate having an active region extending in a first direction; a gate structure disposed on the substrate, intersecting the active region, and extending in a second direction; channel layers disposed on the active region to be spaced apart from each other in a third direction, perpendicular to an upper surface of the substrate, and to be surrounded by the gate structure; source/drain regions disposed on both sides of the gate structure and connected to the channel layers; air gap regions located between the source/drain regions and the active region and spaced apart from each other in the third direction; and semiconductor layers alternately disposed with the air gap regions in the third direction and defining the air gap regions, wherein lower ends of the source/drain regions are located on a level lower than an uppermost air gap region.

14 Claims, 48 Drawing Sheets

SEMICONDUCTOR DEVICE INCLUDING AIR GAP REGIONS BELOW SOURCE/DRAIN REGIONS

CROSS-REFERENCE TO RELATED APPLICATION(S)

This application claims priority to Korean Patent Application No. 10-2021-0057363 filed on May 3, 2021 in the Korean Intellectual Property Office, the subject matter of which is hereby incorporated by reference in its entirety.

BACKGROUND

The inventive concept relates generally to semiconductor devices.

Manufacturers and designers of contemporary and emerging semiconductors face demand(s) for improved performance, faster operating speed(s), and/or expanded functionality. As a result, the integration density of such semiconductor devices is increasing. As a further result, very fine and/or narrowly spaced pattern(s) must be provided to achieve increasingly high degrees of integration for semiconductor devices. Accordingly, in order to overcome limitations in operating characteristics due to decreases in the size of planar, metal oxide semiconductor (MOS) field effect transistors (FETs), various approaches are being studied to effectively develop semiconductor devices having three-dimensional (3D) structure(s).

SUMMARY

Embodiments of the inventive concept provide various semiconductor devices exhibiting improved electrical characteristics and improved operating reliability.

According to one aspect of the inventive concept, a semiconductor device includes; a substrate including an active region extending in a first direction, a gate structure disposed on the substrate, intersecting the active region, and extending in a second direction, channel layers disposed on the active region and spaced apart in a third direction perpendicular to an upper surface of the substrate, wherein the channel layers are surrounded by the gate structure, source/drain regions disposed on opposing sides of the gate structure and connected to the channel layers, air gap regions disposed between the source/drain regions and the active region and spaced apart in the third direction, and semiconductor layers alternately disposed with the air gap regions in the third direction to define the air gap regions, wherein lower ends of the source/drain regions are located at a level lower than an uppermost air gap region among the air gap regions.

According to one aspect of the inventive concept, a semiconductor device includes; a substrate including an active region, a gate structure disposed on the substrate and intersecting the active region, source/drain regions disposed on opposing sides of the gate structure, air gap regions disposed between the source/drain regions and the active region and vertically spaced apart, and semiconductor layers alternately disposed with the air gap regions to define the air gap regions, wherein the source/drain regions pass through at least one air gap region among the air gap regions.

According to one aspect of the inventive concept, a semiconductor device includes; a substrate including an active region extending in a first direction, a gate structure disposed on the substrate, intersecting the active region and extending in a second direction, channel layers disposed on the active region spaced apart in a third direction perpendicular to an upper surface of the substrate, wherein the channel layers are surrounded by the gate structure, source/drain regions disposed on opposing sides of the gate structure and connected to the channel layers, and air gap regions disposed on the active region below the source/drain regions and the gate structure, and spaced apart in the third direction, wherein the air gap regions extend horizontally to the upper surface of the substrate along the active region.

BRIEF DESCRIPTION OF DRAWINGS

The above and other aspects, features, and advantages of the inventive concept will be more clearly understood from the following detailed description, taken in conjunction with the accompanying drawings, in which.

DETAILED DESCRIPTION

Hereinafter, certain embodiments of the inventive concept will be described with reference to the accompanying drawings.

Throughout the written description and drawings, like reference numbers and labels are used to denote like or similar elements, components, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
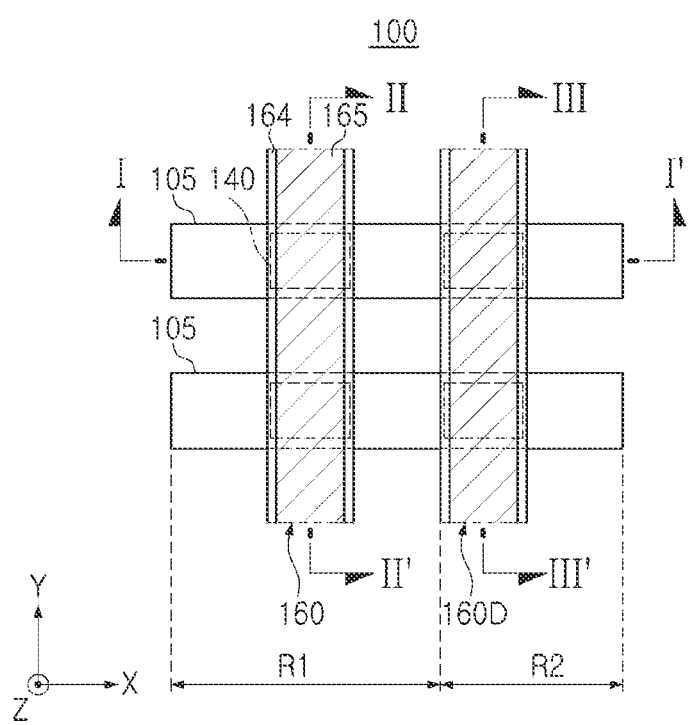
FIG. 1 is a plan (e.g., a top-down or layout) diagram illustrating a semiconductor device according to embodiments.
Figure 2A:
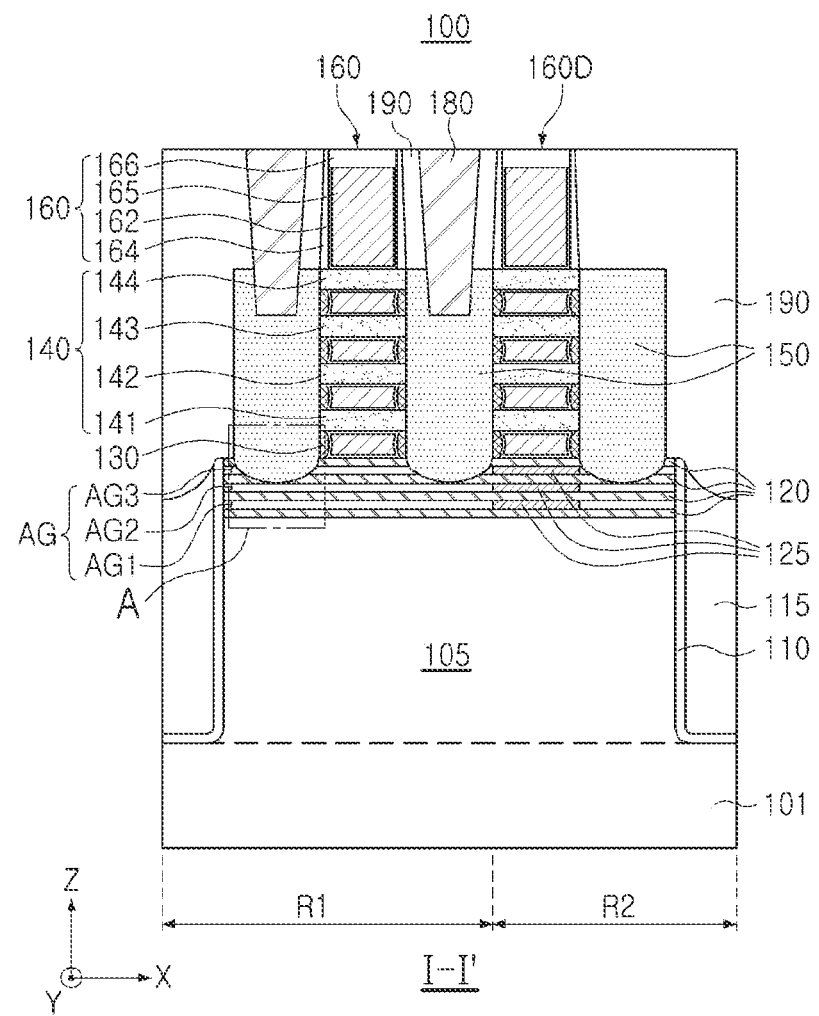
FIGS. 2A and 2B are respective cross-sectional views illustrating semiconductor devices according to embodiments.
Figure 2B:
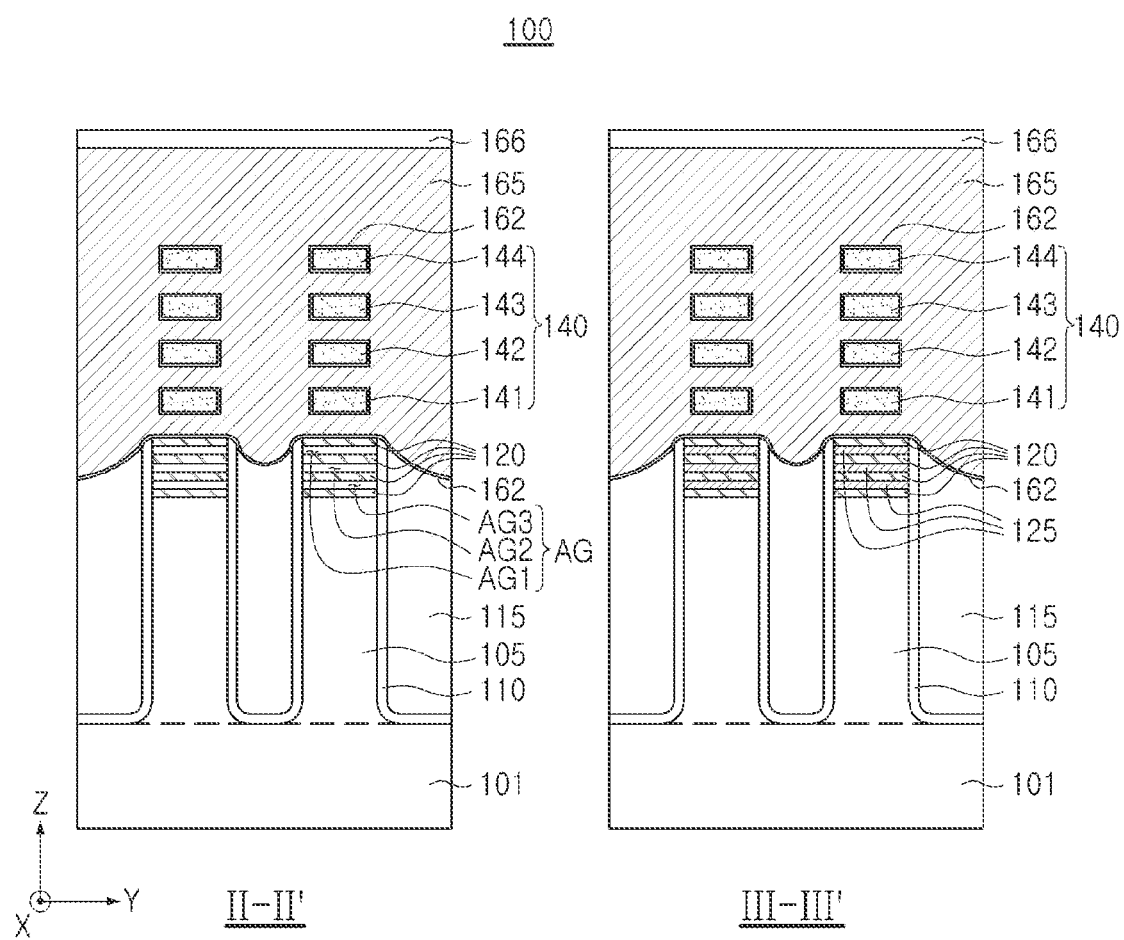
Figure 3:
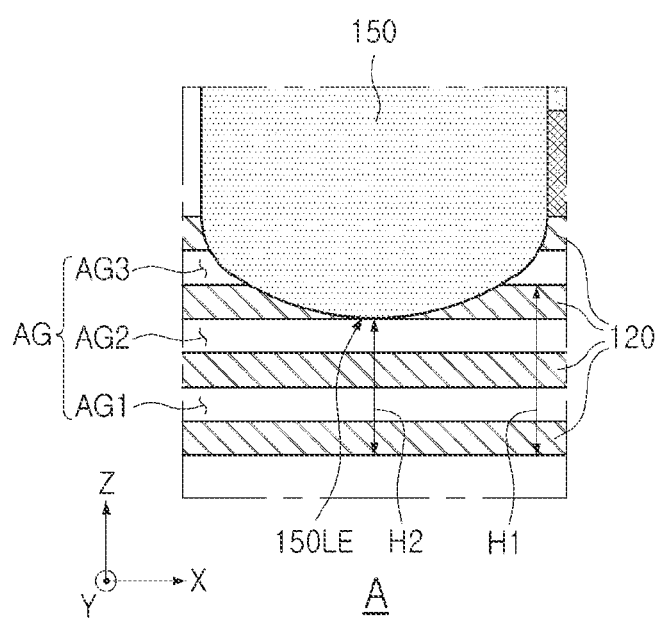
FIGS. 3, 4A and 4B are respective, enlarged views of region 'A' shown in FIG. 2A.

FIG. 1 is a plan diagram illustrating a semiconductor device 100 according to embodiments, FIG. 2A is a cross-sectional view taken along line I-I' of FIG. 1, FIG. 2B includes cross-sectional views taken along lines II-II' and III-III' of FIG. 1, and FIG. 3 is an enlarged view of region 'A' of FIG. 2A.

Referring to FIGS. 1, 2A, 2B and 3, the semiconductor device 100 may include a substrate 101 having first and second regions R1 and R2 and including active regions 105, channel structures 140 (e.g., first, second, third and fourth (hereafter collectively, "first to fourth") channel layers 141, 142, 143, and 144, vertically spaced apart on the active regions 105, a gate structure 160 and a dummy gate structure 160D, extending to intersect the active regions 105, source/drain regions 150 contacting the channel structures 140, air gap regions AG located between the source/drain regions 150 and the active regions 105, semiconductor layers 120 defining the air gap regions AG, and contact plugs 180 connected to the source/drain regions 150. The semiconductor device 100 may further include a liner layer 110, a device isolation layer 115, internal spacer layers 130, and an interlayer insulating layer 190. The gate structure 160 may include a gate dielectric layer 162, a gate electrode 165, gate spacer layers 164, and a gate capping layer 166.

In the semiconductor device 100, the active regions 105 may have a fin shape, respectively, and the gate electrode 165 may be disposed between each of the active regions 105 and the channel structures 140, between the first to fourth channel layers 141, 142, 143, and 144 of the channel structures 140, and on the channel structures 140. Accordingly, the semiconductor device 100 may include a transistor having a multi-bridge channel FET (MBCFET™) structure, which may be a gate-all-around field effect transistor.

The substrate 101 may have an upper surface and may extend horizontally in an X-direction and a Y-direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, a semiconductor-on-insulator (SeOI) layer, or the like.

The first and second regions R1 and R2 of the substrate 101 may be adjacent to or spaced apart from one another. The first region R1 may be a region including air gap regions AG, whereas the second region R2 may be a region omitting the air gap regions AG. For example, the second region R2 may be a support region serving as a support for forming the air gap regions AG during manufacture of the semiconductor device 100. In some embodiments, the first region R1 may be a region in which a transistor including the gate structure 160 is disposed, and the second region R2 may be a region in which a dummy structure including the dummy gate structure 160D is disposed. In some embodiments, the second region R2 may be a region in which a transistor having electrical characteristics different from that of the first region R1 is disposed. In this case, the dummy gate structure 160D may also form a transistor, and the contact plug 180 may be respectively connected to the source/drain regions 150 on both sides of the dummy gate structure 160D. In some embodiments, the arrangement, disposition and/or shape of the first and second regions R1 and R2 may vary with design.

The device isolation layer 115 may define the active regions 105 in the substrate 101. The device isolation layer 115 may be formed by, for example, a shallow trench isolation (STI) process. In some embodiments, the device isolation layer 115 may further include a region having a step difference and extending more deeply in a lower region of the substrate 101. The device isolation layer 115 may expose upper surfaces of the semiconductor layers 120, and may partially expose upper portions of the semiconductor layers 120 and the air gap regions AG according to embodiments. In some embodiments, the device isolation layer 115 may have a curved upper surface to have a higher level, as the device isolation layer 115 is adjacent to the semiconductor layers 120. The device isolation layer 115 may be formed of an insulating material. The device isolation layer 115 may be, for example, an oxide, a nitride, or a combination thereof.

The liner layers 110 may cover side surfaces of the semiconductor layers 120 and side surfaces of the air gap regions AG. The liner layers 110, together with the semiconductor layers 120, may define the air gap regions AG. The liner layers 110 may extend below the semiconductor layers 120 along an interface between the device isolation layer 115 and the active regions 105. However, in some embodiments, the liner layers 110 may be omitted.

The liner layers 110 may include an insulating material or a semiconductor material, for example, an oxide, a nitride, silicon (Si), or a combination thereof. In some embodiments, the liner layers 110 may be epitaxial layers. For example, when the liner layers 110 include silicon (Si), the liner layers 110 may further include doped impurities such as carbon (C).

The active regions 105 may be defined in the substrate 101 by the device isolation layer 115, and may be disposed to extend in a first direction, for example, the X-direction. The active regions 105 may have a structure protruding from the substrate 101. The active regions 105 may be formed as a portion of the substrate 101, or may include an epitaxial layer grown from the substrate 101. In some embodiments, the active regions 105 may include well region(s) including one or more impurities. For example, in a P-type transistor (pFET), the well region may include N-type impurities such as phosphorus (P), arsenic (As), or antimony (Sb), and in an N-type transistor (nFET), the well region may include p-type impurities such as boron (B), gallium (Ga), or aluminum (Al). When well region(s) are included, they may be formed to a predetermined depth relative to the upper surface(s) of the active regions 105.

The semiconductor layers 120 may be disposed on the active regions 105 to be spaced apart from each other in a direction, perpendicular to the upper surfaces of the active regions 105, for example, in a Z-direction. The semiconductor layers 120 may be in contact with the air gap regions AG, and may be alternately disposed with the air gap regions AG. The semiconductor layers 120 may define air gap regions AG. The number of semiconductor layers 120 to be stacked may be changed according to the number of air gap regions AG.

The semiconductor layers 120 may be epitaxial layers grown from the active regions 105. The semiconductor layers 120 may include a semiconductor material, for example, silicon (Si) or silicon germanium (SiGe). The semiconductor layers 120 may be formed of, for example, the same material as the substrate 101. In some embodiments, the semiconductor layers 120 may further include doped impurities. The impurities may include at least one of phosphorus (P), arsenic (As), antimony (Sb), boron (B), gallium (Ga), aluminum (Al), carbon (C), nitrogen (N), or oxygen (O), for example.

Air gap regions AG may be disposed between the active regions 105 and the source/drain regions 150 and may be spaced apart in the Z-direction. For example, as illustrated in FIGS. 2A, 2B and 3, the air gap regions AG may include first, second and third air gap regions AG1, AG2, and AG3 spaced apart from each other by the semiconductor layers 120. Here, the number of air gap regions constituting the air gap regions AG may be vary by design (e.g., 2, 3, 4, 5, 6, etc.). The air gap regions AG may variously include regions including ambient air or selected gas(es), however, for ease of description, the air gap regions AG will be described hereafter as including a single region or layer.

The air gap regions AG may include upper and lower surfaces defined by the semiconductor layer 120, as well as side surfaces defined by the liner layer 110 and lower sacrificial layers 125. Each of the first to third air gap regions AG1, AG2, and AG3 may extend horizontally substantially in parallel with the upper surface of the substrate 101 and/or the upper surface of the active region 105. For example, each of the first to third air gap regions AG1, AG2, and AG3 may be substantially flat in shape and may substantial extend in the X-direction.

Each of the first, second and third air gap regions AG1, AG2, and AG3 may have, for example, a "height" (e.g., measured in the Z direction) ranging from about 1.0 nm to about 10 nm. Analysis has shown that heights for the first, second and third air gap regions AG1, AG2, and AG3 less than this range results in less than optimal electrical performance for the transistors described hereafter. Further, heights for the first, second and third air gap regions AG1, AG2, and AG3 greater than this range result in manufacturing difficulties. The air gap regions AG may be disposed on the active regions 105, may extend along the active regions 105, and may have a shape extending from below source/drain regions 150 into below the channel structures 140, below the gate structure 160, and below the dummy gate structure 160D. For example, the air gap regions AG may be disposed between the active regions 105 and the source/drain regions 150 as well as between the active regions 105 and the gate structure 160.

The lower sacrificial layers 125 may be interposed between the semiconductor layers 120 to form the air gap regions AG. The lower sacrificial layers 125 may be remaining layers, after at least a portion thereof is removed to form the air gap regions AG when the semiconductor device 100 is manufactured. The lower sacrificial layers 125 may be disposed between the semiconductor layers 120 to oppose side surfaces of the air gap regions AG. At least a portion of the lower sacrificial layers 125 may be horizontally spaced apart from the source/drain regions 150 on both sides of the gate structure 160. The lower sacrificial layers 125 may remain below the dummy gate structure 160D in the second region R2. In some embodiments such as the one illustrated in FIG. 2A, a width measured in the X-direction for each of the lower sacrificial layers 125 may be the same as a width measured in the X-direction for each of the channel structures 140.

The lower sacrificial layers 125 may be epitaxial layers grown from the semiconductor layers 120. The lower sacrificial layers 125 may include a semiconductor material different from that of the semiconductor layers 120, for example, silicon (Si) or silicon germanium (SiGe).

The channel structures 140 may be formed on the semiconductor layers 120 and the air gap regions AG in regions in which the active regions 105 intersect the gate structure 160 and the dummy gate structure 160D. The channel structures 140 may include first to fourth channel layers 141, 142, 143, and 144, which may be two or more channel layers spaced apart in the Z-direction. The channel structures 140 may be connected to the source/drain regions 150. Each of the channel structures 140 may have a width measured in the Y-direction less than or equal to a length of the active regions 105 measured in the Y-direction, and may have a width substantially similar to a width measured in the X-direction for the gate structure 160 in the X-direction. In some embodiments, the channel structures 140 may have reduced widths, such that side surfaces of the channel structures 140 are substantially disposed below the gate structure 160 in the X-direction.

The channel structures 140 may be formed of a semiconductor material, and may include, for example, at least one of silicon (Si), silicon germanium (SiGe), or germanium (Ge). The channel structures 140 may be formed of, for example, the same material as the substrate 101. In some embodiments, the channel structures 140 may include an impurity region located in a region adjacent to the source/drain regions 150. The number and shape of channel layers constituting one of the channel structures 140 may vary by design. For example, in some embodiments, the channel structures 140 may further include a channel layer disposed below a lowermost portion of the gate electrode 165.

The source/drain regions 150 may be respectively disposed on the semiconductor layers 120, on opposing sides of the gate structure 160, on opposing sides of the dummy gate structure 160D, and on opposing sides of the channel structures 140. The source/drain regions 150 may be arranged to cover side surfaces of each of the first to fourth channel layers 141, 142, 143, and 144 of the channel structure 140 and upper surfaces of some of the semiconductor layers 120. The source/drain regions 150 may be disposed in regions in which the semiconductor layers 120 are partially recessed.

The source/drain regions 150 may be disposed to pass through at least one of the air gap regions AG (e.g. the third air gap region AG3 or an uppermost air gap region). As illustrated in FIG. 3, a lower end 150LE of the source/drain region 150 may be disposed on a level lower than the third air gap region AG3, as the uppermost air gap region. A height H1 from an upper surface of the active region 105 to a lower surface of the third air gap region AG3 may be greater than a height H2 from the upper surface of the active region 105 to the lower end 150LE of the source/drain region 150. The lower end 150LE of the source/drain region 150 may be in contact with the semiconductor layer 120, and may be located in the semiconductor layer 120, but is not limited thereto. The source/drain regions 150 may be at least located on a higher level than the first air gap region AG1, a lowermost portion of the air gap regions AG. Therefore, at least one air gap region may exist below the source/drain regions 150. In the source/drain region 150, a region including the lower end 150LE may be surrounded by at least one of the air gap regions AG.

The source/drain regions 150 and the air gap regions AG may be arranged as described above to inhibit leakage current from the source/drain regions 150 into the well region of the active regions 105. In addition, since the source/drain regions 150 may be disposed to expand in a downward direction to partially penetrate the air gap regions AG, a volume of the source/drain regions 150 may be secured to decrease resistance of the source/drain regions 150. Therefore, an increase in length of a channel in a lower portion of the channel structures 140 may be prevented, and stress applied to the channel structures 140 from the source/drain regions 150 may be secured, to reduce resistance of the channel structures 140.

Upper surfaces of the source/drain regions 150 may be dispose at a substantially similar height relative to the lower surfaces of the gate structure 160 on the channel structures 140, and heights of the upper surfaces of the source/drain regions 150 may vary by design. In some embodiments, the source/drain regions 150 may be connected to (or merged with) each other on two or more active regions 105 adjacent in the Y-direction to form a single source/drain region 150. Some of the source/drain regions 150 (e.g., a source/drain region 150 to which only the dummy gate structure 160D is connected and to which the contact plug 180 is not connected) may be a dummy source/drain region.

The gate structure 160 may be disposed on the semiconductor layers 120 and the channel structures 140 to intersect the active regions 105 and the channel structures 140, to extend in the second direction, for example, the Y-direction Channel regions of transistors may be formed in the channel structures 140 intersecting the gate electrode 165 of the gate structure 160. The gate structure 160 may include a gate electrode 165, a gate dielectric layer 162 between the gate electrode 165 and the channel structures 140, gate spacer layers 164 on side surfaces of the gate electrode 165, and a gate capping layer 166 on a top surface of the gate electrode 165. The dummy gate structure 160D may be spaced apart from the gate structure 160 in the X-direction. With respect to the dummy gate structure 160D, the foregoing description of the gate structure 160 may be applied, unless otherwise specified.

The gate dielectric layer 162 may be disposed between the semiconductor layer 120 and the gate electrode 165 and between the channel structures 140 and the gate electrode 165, and may be disposed to cover at least a portion of surfaces of the gate electrode 165. For example, the gate dielectric layer 162 may be disposed to surround all surfaces of the gate electrode 165, except the top surface thereof. The gate dielectric layer 162 may extend between the gate electrode 165 and the gate spacer layers 164, but is not limited thereto. The gate dielectric layer 162 may include an oxide, a nitride, or a high-k material. The high-k material may refer to a dielectric material having a higher dielectric constant than that of a silicon oxide layer ($SiO_2$). The high-k material may be, for example, any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$). In some embodiments, the gate dielectric layer 162 may be formed of multi-layers.

The gate electrode 165 may be disposed on the semiconductor layer 120 to fill spaces between the channel structures 140 and to extend above the channel structures 140. The gate electrode 165 may be spaced apart from the channel structure 140 by the gate dielectric layer 162. The gate electrode 165 may include a conductive material, for example, a metal nitride such as titanium nitride (TiN), tantalum nitride (TaN), or tungsten nitride (WN), and/or a metal material such as aluminum (Al), tungsten. (W), or molybdenum (Mo), or a semiconductor material such as doped polysilicon. In some embodiments, the gate electrode 165 may be formed of two or more multi-layers.

The gate spacer layers 164 may be disposed on both sides of the gate electrode 165. The gate spacer layers 164 may insulate the source/drain regions 150 and the gate electrodes 165. The gate spacer layers 164 may have a multi-layer structure according to embodiments. The gate spacer layers 164 may be formed of an oxide, a nitride, or an oxynitride, and in particular, a low-k film.

The gate capping layer 166 may be disposed on the gate electrode 165, and side surfaces of the gate capping layer 166 may be surrounded by the gate spacer layers 164.

The internal spacer layers 130 may be disposed between the channel structures 140. The gate electrode 165 may be stably spaced apart from the source/drain regions 150 by the internal spacer layers 130 in order to be electrically isolated. The internal spacer layers 130 may include side surfaces opposing the gate electrode 165 having an inwardly rounded shape extending towards the gate electrode 165, but the inventive concept is not limited thereto. The internal spacer layers 130 may be formed of an oxide, a nitride, or an oxynitride, and in particular, a low-k film. However, in some embodiments, the internal spacer layers 130 may be omitted.

The contact plugs 180 may pass through the interlayer insulating layer 190 to connect the source/drain regions 150, and may apply an electrical signal to the source/drain regions 150. Each of the contact plugs 180 may have inclined side surfaces in which a width of a lower portion is narrower than a width of an upper portion, according to a prescribed aspect ratio, however, the scope of the inventive concept is not limited thereto. The contact plugs 180 may extend lower than a lower surface of the fourth channel layer 144, however, the inventive concept is not limited thereto. In some embodiments, the contact plugs 180 may be disposed to contact upper surfaces of the source/drain regions 150, without recessing the source/drain regions 150.

The contact plugs 180 may include a metal silicide layer disposed on a lower end including a lower surface, and may further include a barrier layer disposed on an upper surface of the metal silicide layer and sidewalls of the contact plugs 180. The barrier layer may include, for example, a metal nitride such as a titanium nitride layer (TiN), a tantalum nitride layer (TaN), or a tungsten nitride layer (WN). The contact plugs 180 may include, for example, a metal material such as aluminum (Al), tungsten (W), molybdenum (Mo), or the like. Here, the number and arrangement of conductive layers constituting the contact plugs 180 may vary by design.

The interlayer insulating layer 190 may be disposed to cover the source/drain regions 150, the gate structure 160, and the dummy gate structure 160D, and to cover the device isolation layer 115. The interlayer insulating layer 190 may include at least one of an oxide, a nitride, or an oxynitride, and may include, for example, a low-k material. In some embodiments, the interlayer insulating layer 190 may include a plurality of insulating layers.

Figure 4A:
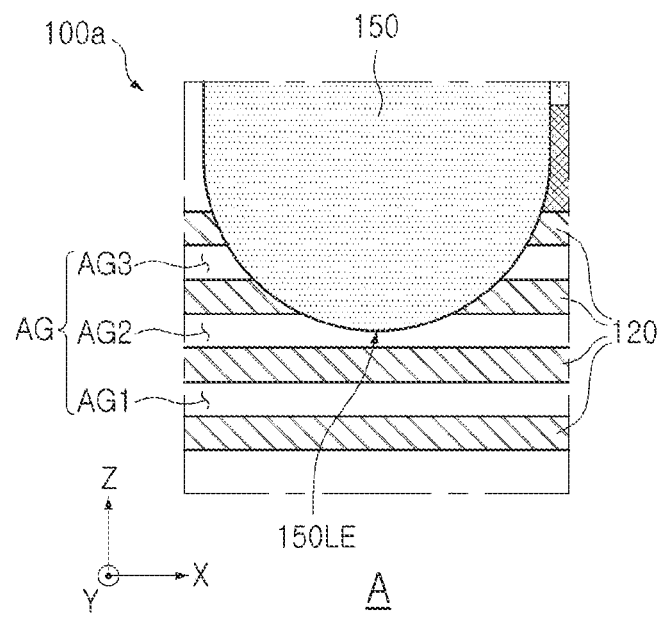
Figure 4B:
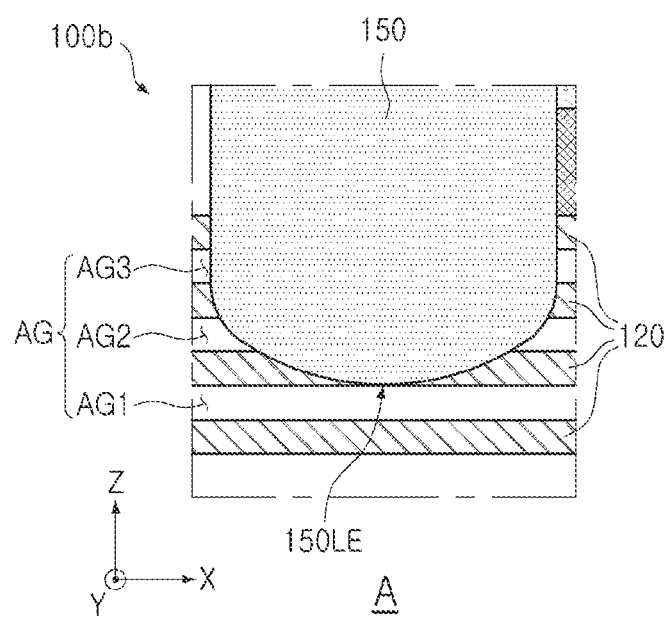

Analogous to FIG. 3, FIGS. 4A and 4B are respective, enlarged views of region 'A' of FIG. 2A.

Referring to FIG. 4A, in a semiconductor device 100a, a lower end 150LE of a source/drain region 150 may be located in a second air gap region AG2. In contrast to the embodiment of FIG. 3, the lower end 150LE may partially protrude downward from the semiconductor layer 120, and may be located in the second air gap region AG2. A position of the lower end 150LE may be changed, according to a process of forming a recess region in which the source/drain region 150 is disposed during a process of manufacturing the semiconductor device 100a.

Referring to FIG. 4B, in a semiconductor device 100b, a source/drain region 150 may pass through a third air gap region AG3 as an uppermost air gap region and a second air gap region AG2 as a lower air gap region. A lower end 150LE of the source/drain region 150 may be located in a semiconductor layer 120 below the second air gap region AG2.

As such, in some embodiments, a position of the lower end 150LE of the source/drain region 150 may vary within a range passing through the third air gap region AG3 as the uppermost air gap region and located above a first air gap region AG1 as a lowermost air gap region.

Figure 5A:
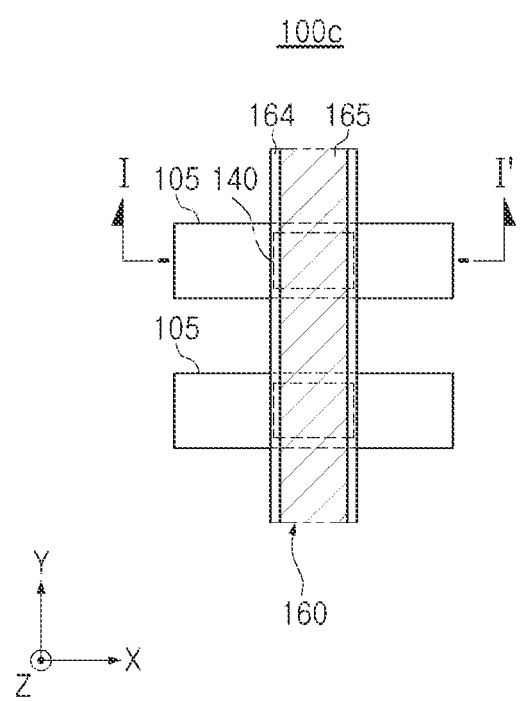
FIGS. 5A and 5B are respective plan and cross-sectional views illustrating semiconductor devices according to embodiments.
Figure 5B:
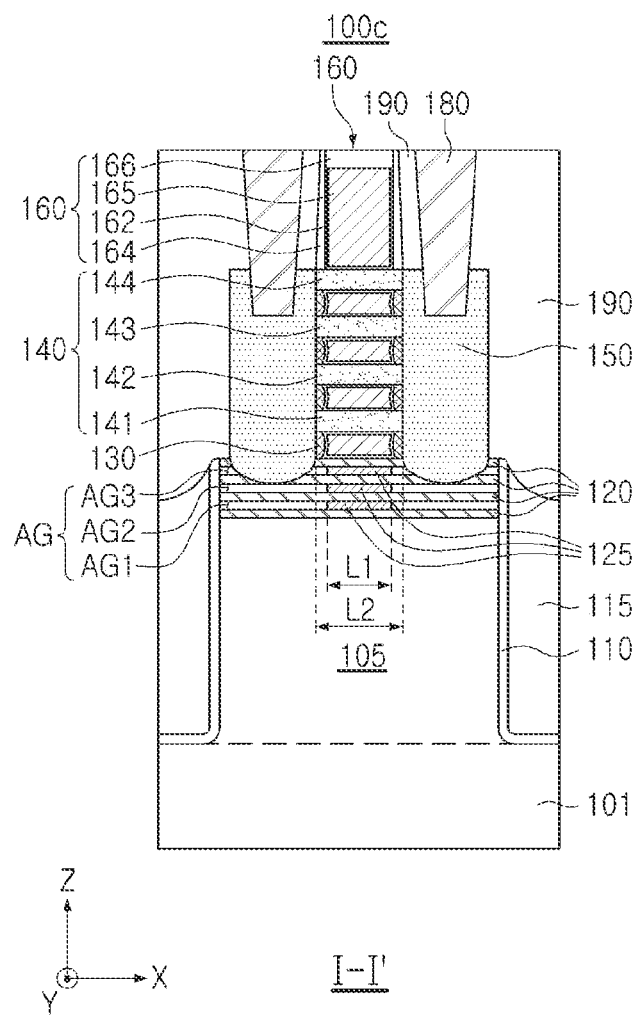

FIG. 5A is a plan view illustrating a semiconductor device according to embodiments, and FIG. 5B is a cross-sectional view taken along line I-I' of FIG. 5A.

Referring to FIGS. 5A and 5B, in a semiconductor device 100c, lower sacrificial layers 125 may be disposed below a gate structure 160 and between semiconductor layers 120. The lower sacrificial layers 125 may be disposed to fill some regions of air gap regions AG. The lower sacrificial layers 125 may be remaining layers, after a portion thereof is removed to form the air gap regions AG when the semiconductor device 100c is manufactured. The lower sacrificial layers 125 may not extend below source/drain regions 150. In the X-direction, a length L1 of each of the lower sacrificial layers 125 may be shorter than a length L2 of a channel structure 140, but is not limited thereto.

In some embodiments like FIGS. 5A and 5B, when the air gap regions AG are formed, the lower sacrificial layers 125 may perform a supporting function. Therefore, in contrast to the embodiments of FIGS. 1, 2A and 2B, a separate second region R2 may be omitted.

Figure 6A:
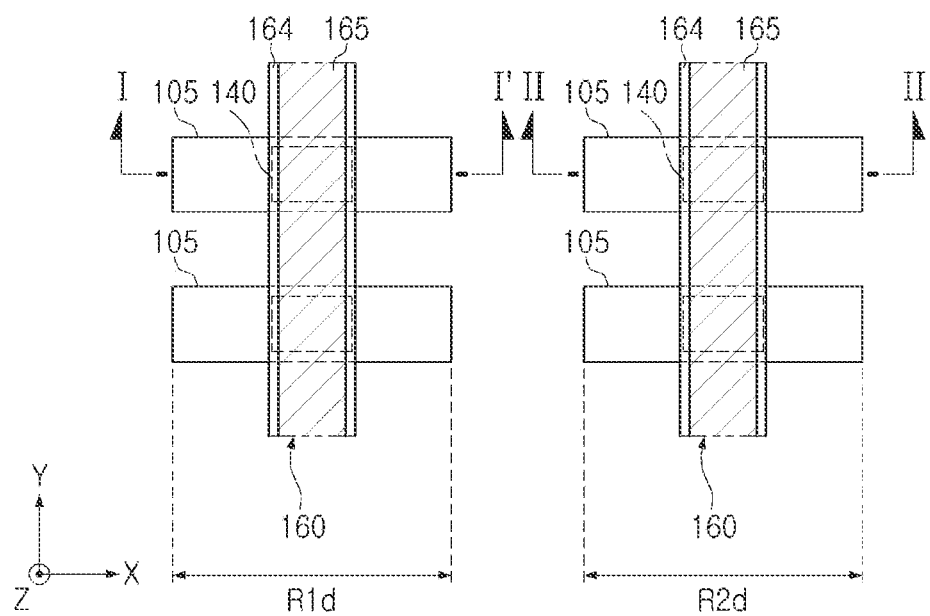
FIGS. 6A and 6B are respective plan and cross-sectional views illustrating semiconductor devices according to embodiments.
Figure 6B:
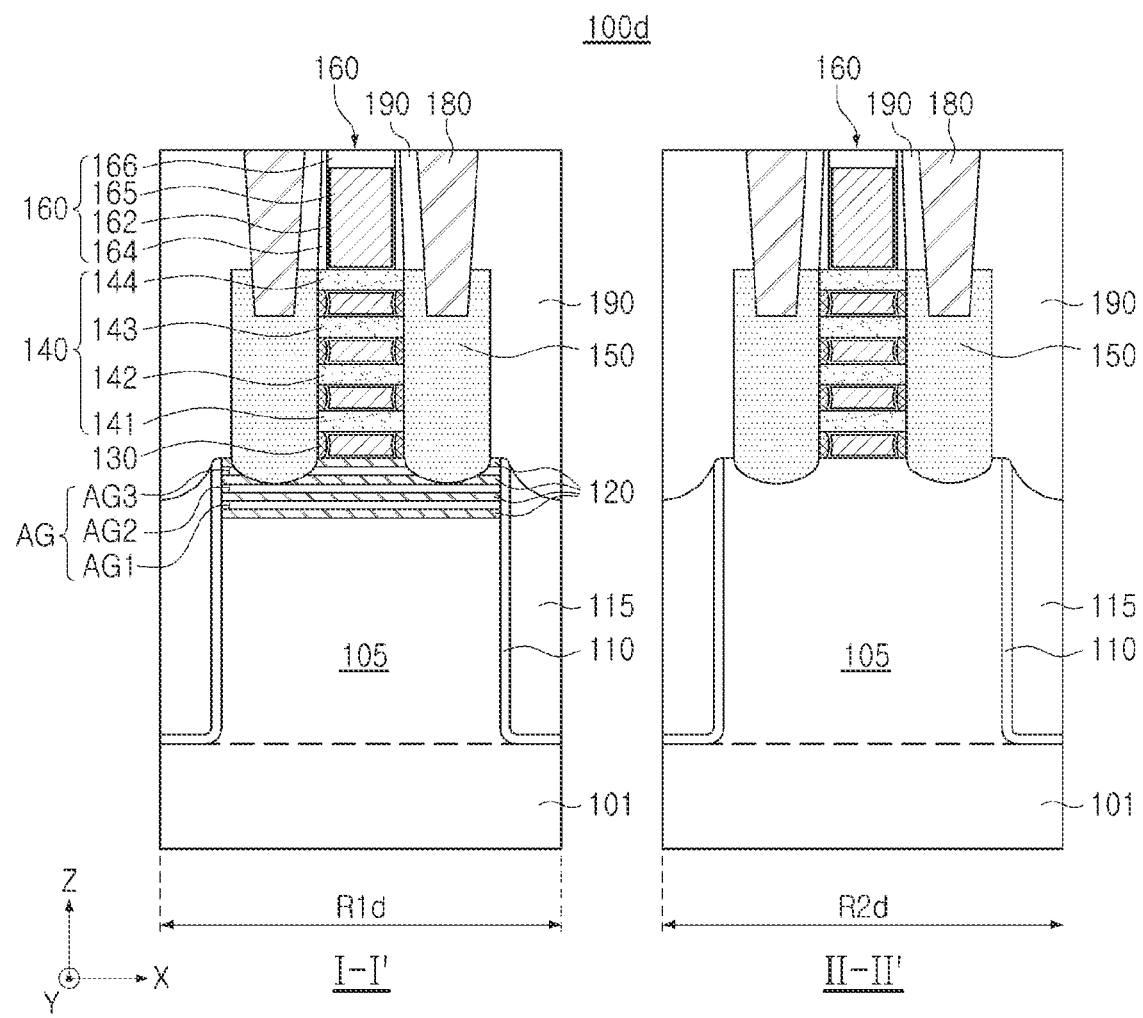

FIG. 6A is a plan view illustrating a semiconductor device according to embodiments, and FIG. 6B is a cross-sectional view taken along lines I-I' and II-II' of FIG. 6A.

Referring to FIGS. 6A and 6B, in a semiconductor device 100d, in a first region R1d of a substrate 101, air gap regions AG may be disposed below source/drain regions 150 and a gate structure 160. In a second region R2d of the substrate 101, air gap regions AG may not be disposed below the source/drain regions 150 and the gate structure 160. For example, in the semiconductor device 100d, air gap regions AG may be disposed in some transistor regions, and air gap region AG may not be disposed in some other transistor regions. For example, the first region R1d may be a pFET region, and the second region R2d may be an nFET region, or vice versa. For example, the first region R1d may be a high voltage transistor region, and the second region R2d may be a low voltage transistor region, or vice versa.

In some embodiments, lower sacrificial layers 125 may remain below the gate structure 160 in the first region R1d, as in the embodiment of FIG. 5B. In some embodiments, semiconductor layers 120 may be further disposed below the gate structure 160 in the second region R2d, as in the first region R1d. In this case, the lower sacrificial layers 125 may be disposed between the semiconductor layers 120. According to embodiments, an upper surface of an active region 105 in the second region R2d may have the same position as in the first region R1d.

Figure 7A:
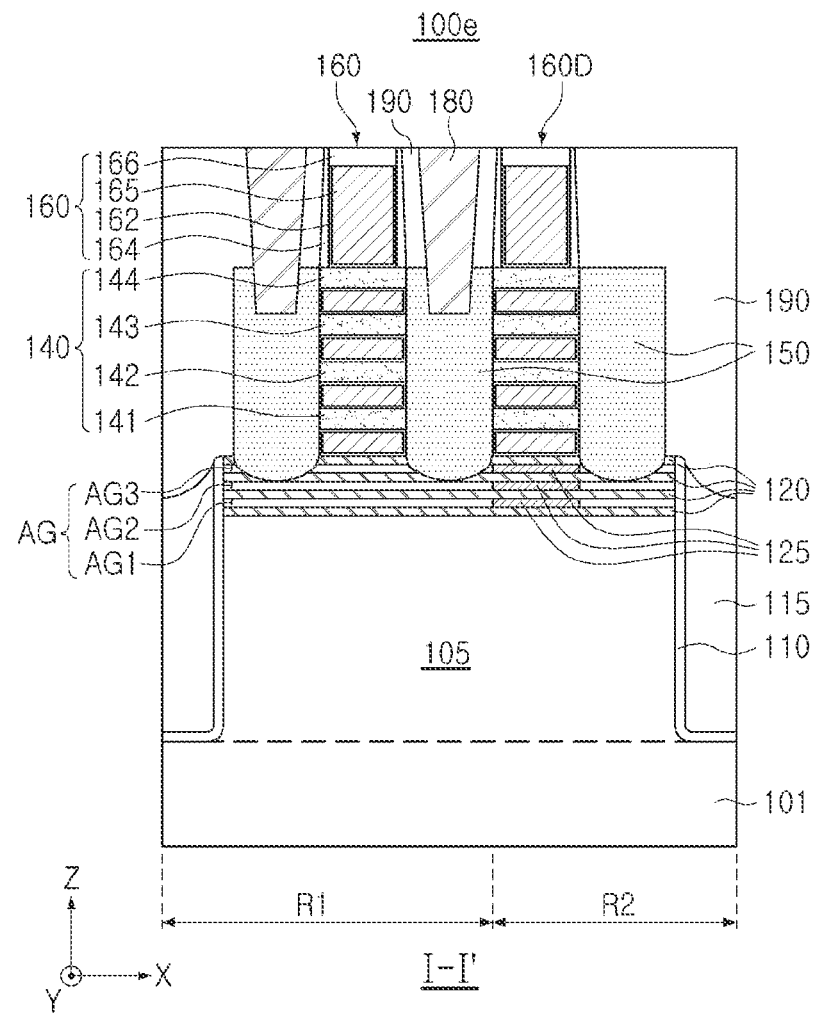
FIGS. 7A, 7B and 7C are respective cross-sectional views illustrating semiconductor devices according to embodiments.
Figure 7B:
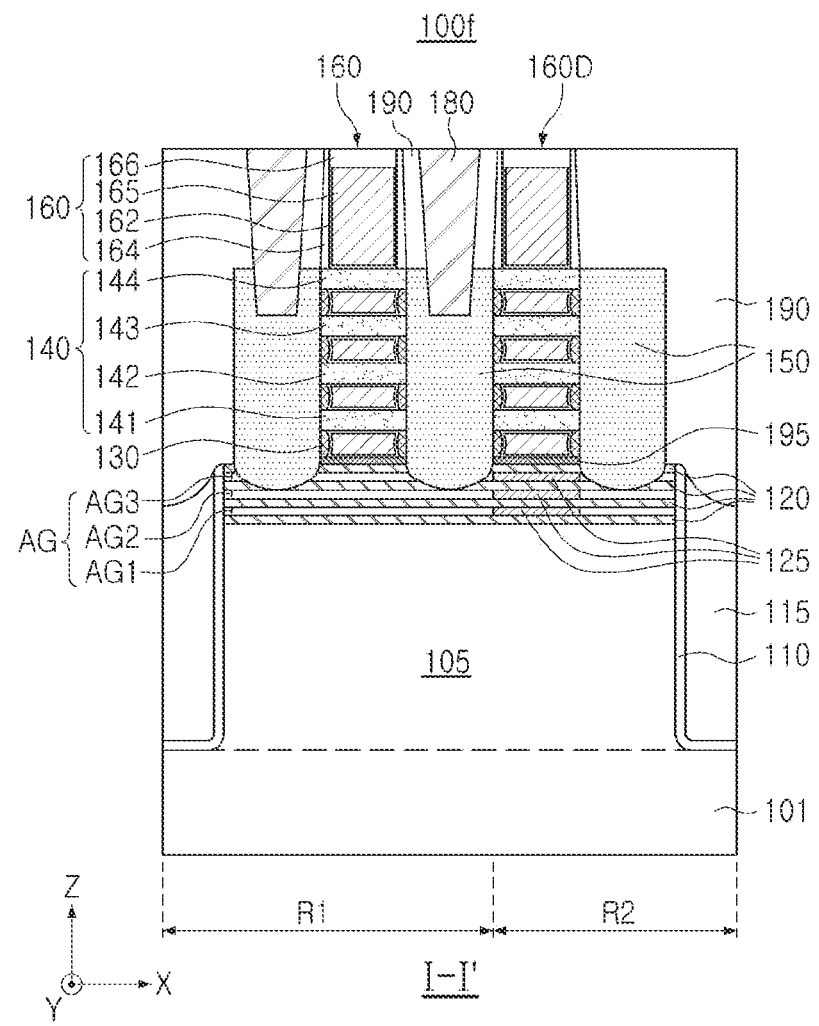
Figure 7C:
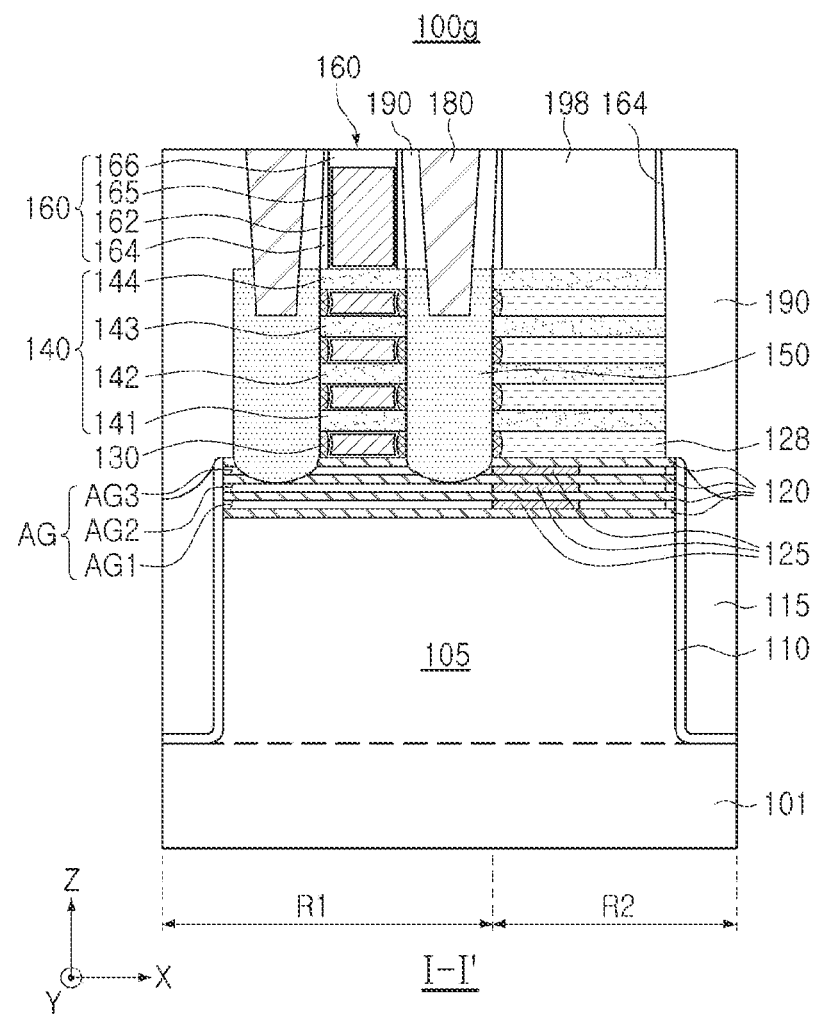

FIGS. 7A, 7B and 7C are respective cross-sectional views illustrating semiconductor devices according to embodiments and generally correspond to the cross-sectional view of FIG. 2A.

Referring to FIG. 7A, a semiconductor device 100e omits an internal spacer layer 130 in contrast to the embodiments of FIGS. 1, 2A and 2B. Thus, gate electrodes 165 located between channel structures 140 and below a fourth channel layer 144 may be disposed to expand in the X-direction. Also, the gate electrodes 165 may be spaced apart from source/drain regions 150 by gate dielectric layers 162.

Consistent with this structure omitting the internal spacer layer 130, the source/drain regions 150 may exhibit improved crystallinity when the source/drain regions 150 are grown. In some embodiments, an internal spacer layer 130 may be selectively omitted from some elements of the semiconductor device 100e. For example, when SiGe is used for the source/drain regions 150 in a pFET, an internal spacer layer 130 may be selectively omitted only in the pFET to improve crystallinity of SiGe.

Referring to FIG. 7B, a semiconductor device 100f may further include a barrier layer 195 disposed on uppermost semiconductor layers 120, below a gate structure 160 and a dummy gate structure 160D. The barrier layer 195 may prevent diffusing or may control an amount of diffusing impurities in an active region 105 and/or the semiconductor layers 120 into a channel structure 140 during a process of manufacturing the semiconductor device 100f. The barrier layer 195 may include carbon (C), for example, silicon carbide (SiC), silicon germanium carbide (SiGeC), or a combination thereof.

Here, the barrier layer 195 may be selectively applied to any one or more of the previously described embodiments.

Referring to FIG. 7C, a semiconductor device 100g may further include upper sacrificial layers 128 and a dummy mask layer 198 disposed in a second region R2. In contrast to the embodiments of FIGS. 1, 2A and 2B, the semiconductor device 100g, may include a dummy structure having a structure different from that of the gate structure 160 which may be disposed in the second region R2 instead of a dummy gate structure 160D.

The dummy structure may include the dummy mask layer 198, gate spacer layers 164 on both side walls of the dummy mask layer 198, a channel structure 140 below the dummy mask layer 198, upper sacrificial layers 128 alternately disposed with the channel structure 140, and internal spacer layers 130 disposed on at least one side of the upper sacrificial layers 128. When the semiconductor device 100g is manufactured, such a structure may be formed in the second region R2 by forming the dummy mask layer 198 having a wider width, instead of the sacrificial gate structure 170 in forming a sacrificial gate structure 170 described below with reference to FIGS. 15A, 15B and 15C. Therefore, the upper sacrificial layers 128 may remain below the dummy mask layer 198 to form the dummy structure. As such, according to some embodiments, the shape of the dummy structure disposed in the second region R2 may be vary by design.

FIGS. 8A to 19C are various views collectively illustrating method(s) of manufacturing a semiconductor device according to embodiments. Here, FIGS. 8A to 19C may be considered in relation to the embodiments of FIGS. 1, 2A and 2B.

Figure 8A:
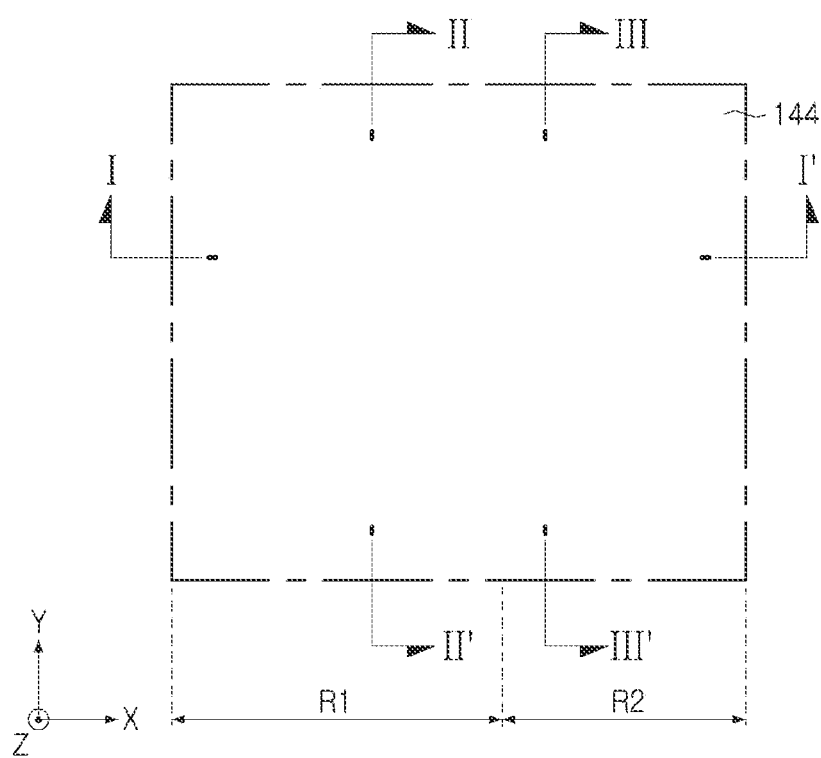
FIGS. 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B and 19C (hereafter collectively, "FIGS. 8A to 19C") are various views illustrating method(s) of manufacturing various semiconductor devices according to embodiments.
Figure 8B:
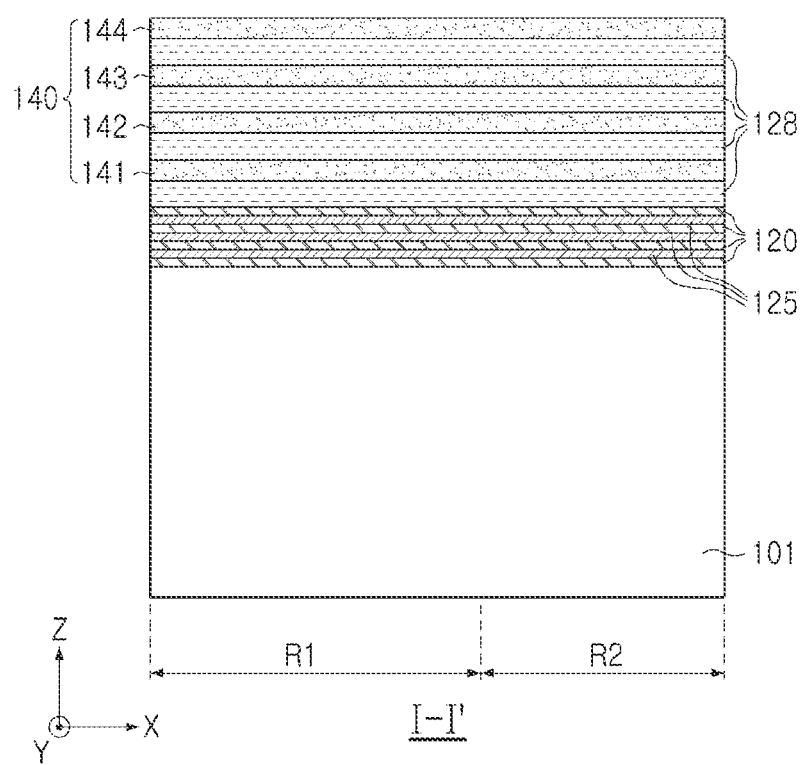
Figure 8C:
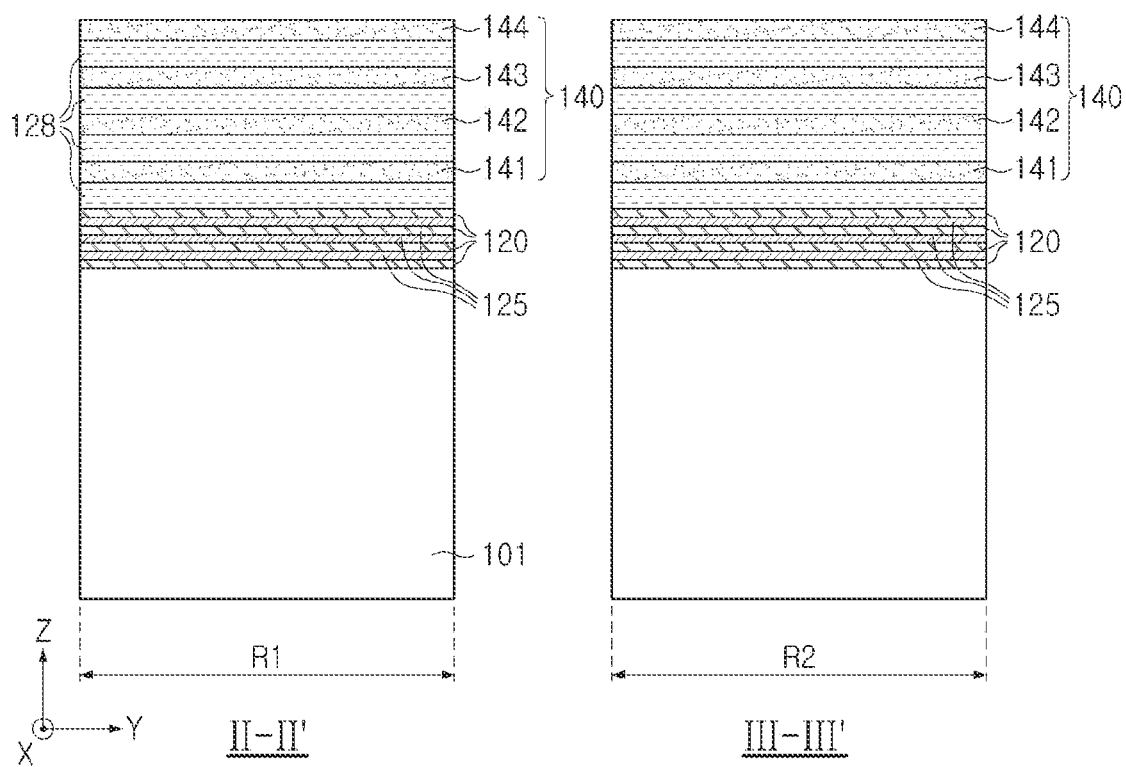

Referring to FIGS. 8A, 8B and 8C, semiconductor layers 120 and lower sacrificial layers 125 may be alternately stacked on a substrate 101 to prepare a lower stack structure, and upper sacrificial layers 128 and channel structures 140 including first to fourth channel layers 141, 142, 143, and 144 may be alternately stacked on the lower stack structure to prepare an upper stack structure.

In some embodiments, an ion implantation process may be performed to form a well region to a predetermined depth from an upper surface of the substrate 101. However, the ion implantation process may be omitted.

The lower sacrificial layers 125 may be layers to be partially removed by a subsequent process to form air gap regions AG, as illustrated in FIGS. 2A and 2B. The upper sacrificial layers 128 may be replaced by a gate dielectric layer 162 and a gate electrode 165, as illustrated in FIGS. 2A and 2B, by a subsequent process.

To have etching selectivity to each other, the lower sacrificial layers 125 may be formed of a different material from the semiconductor layers 120, and the upper sacrificial layers 128 may be formed of a different material from the channel structures 140. The lower sacrificial layers 125, the semiconductor layers 120, the upper sacrificial layers 128, and the channel structures 140 may include, for example, a semiconductor material including at least one of silicon (Si), silicon germanium (SiGe), or germanium (Ge), and may or may not include impurities. For example, the lower sacrificial layers 125 and the upper sacrificial layers 128 may include silicon germanium (SiGe), and the semiconductor layers 120 and the channel structures 140 may include silicon (Si).

The lower sacrificial layers 125, the semiconductor layers 120, the upper sacrificial layers 128, and the channel structures 140 may be formed from the substrate 101 by performing an epitaxial growth process. Each of the lower sacrificial layers 125 and each of the semiconductor layers 120 may have a thickness ranging from about 1.0 nm to about 10 nm. Each of the upper sacrificial layers 128 and each of the channel structures 140 may have a thickness ranging from about 1 Å to about 100 nm. Each of the upper sacrificial layers 128 and each of the channel structure 140 may have a thickness greater than that of each of the lower sacrificial layers 125 and each of the semiconductor layers 120, but are not limited thereto. The number of layers in the lower sacrificial layers 125, the semiconductor layers 120, the upper sacrificial layers 128, and the channel structure 140 may be variously changed, respectively, in embodiments.

Figure 9A:
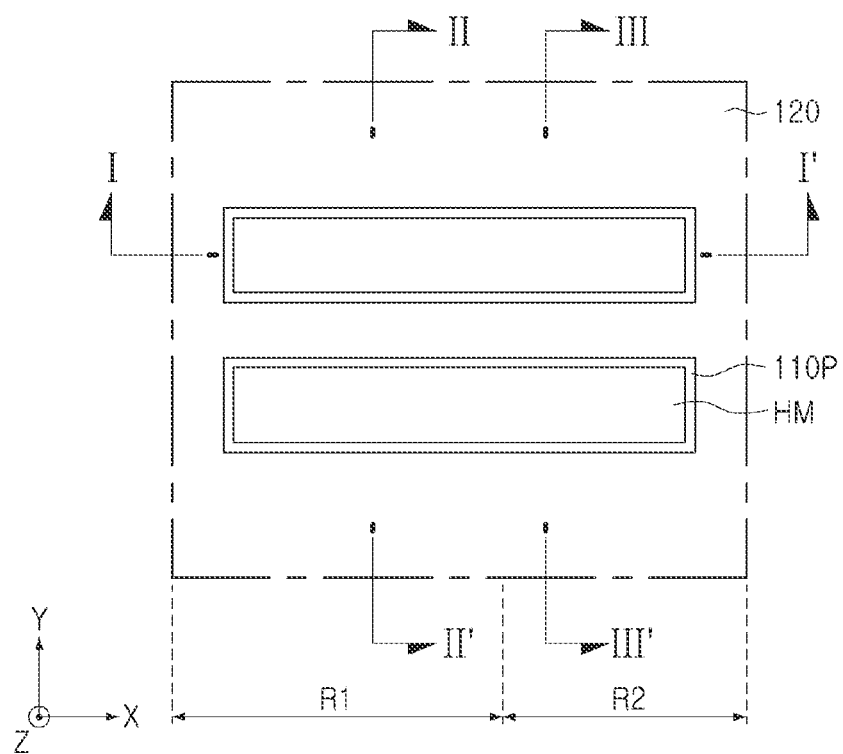
Figure 9B:
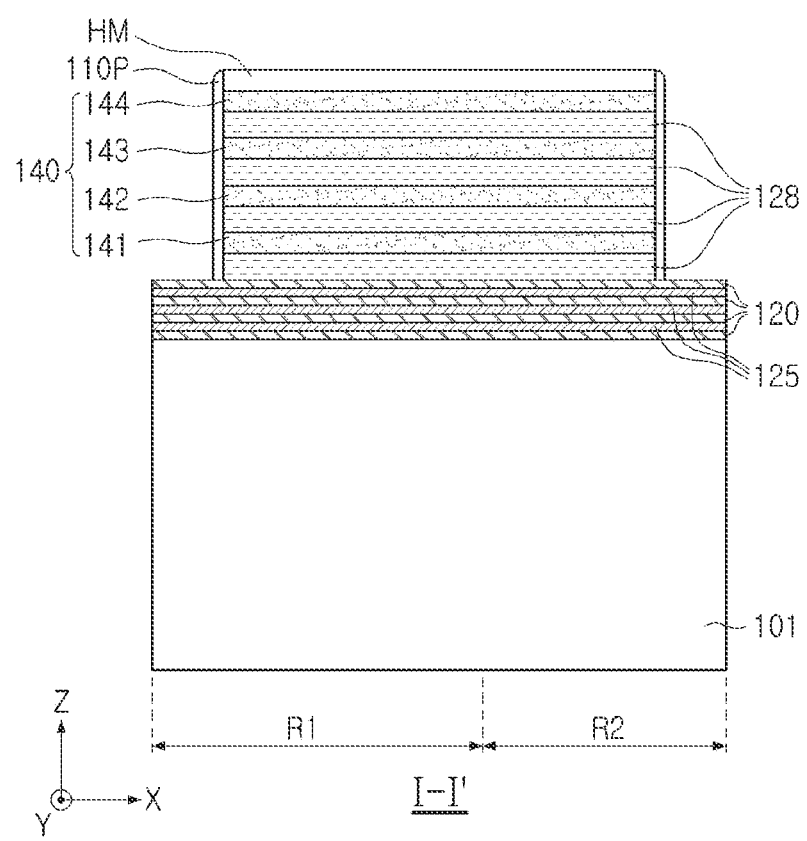
Figure 9C:
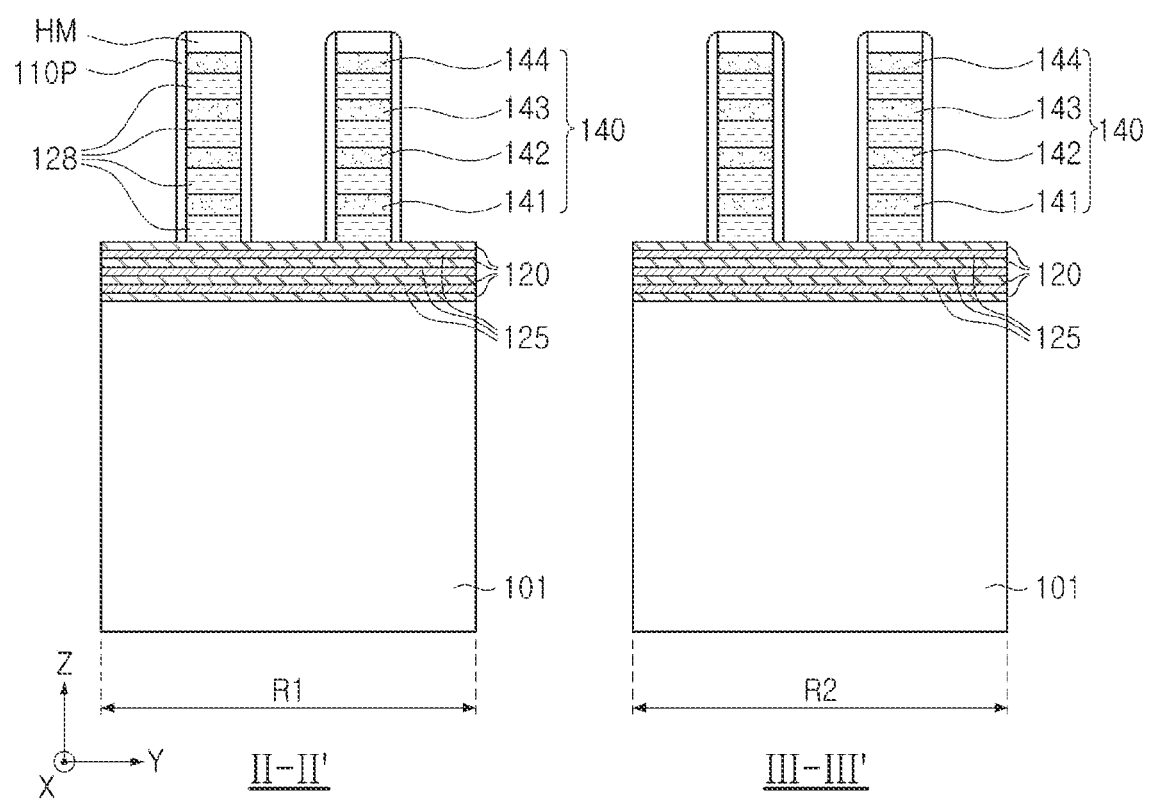

Referring to FIGS. 9A, 9B and 9C, the upper stack structure of the upper sacrificial layers 128 and the channel structures 140 may be patterned and a preliminary liner layer 110P may be formed.

A hard mask layer HM may be formed on the upper stack structure, and the upper stack structure may be then patterned to extend in the X-direction to remain in a region corresponding to the active region 105 of FIGS. 2A and 2B.

Next, a preliminary liner layer 110P may be formed on the patterned sidewalls of the upper stack structure. The preliminary liner layer 110P may be formed in a form of a spacer, and may be formed to completely surround the upper stack structure in a plan view, as illustrated in FIG. 9A. The preliminary liner layer 110P may be a layer that may be removed by a subsequent process. The preliminary liner layer 110P may include, for example, silicon nitride.

Figure 10A:
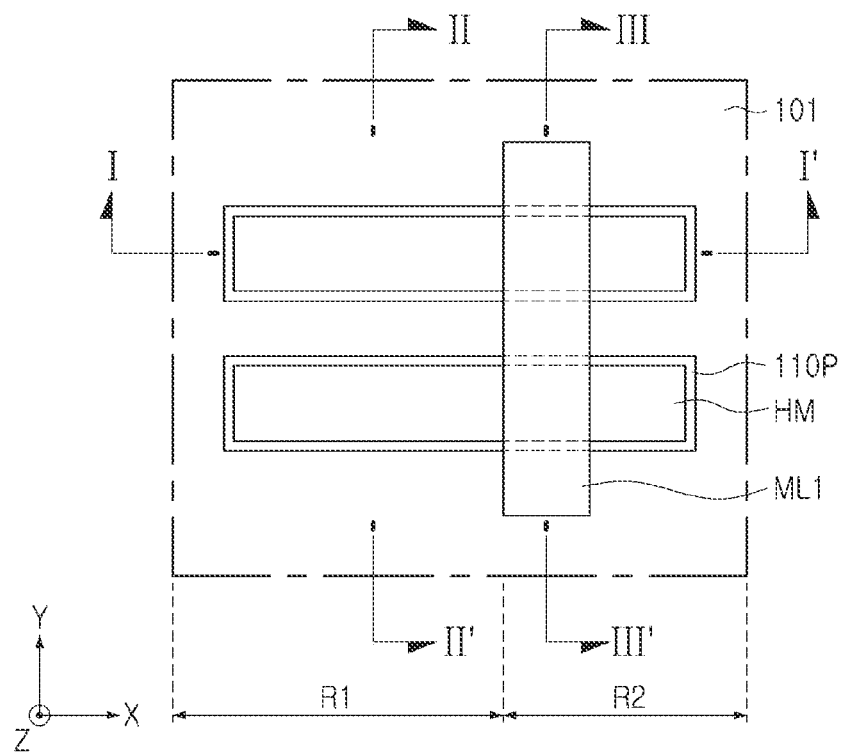
Figure 10B:
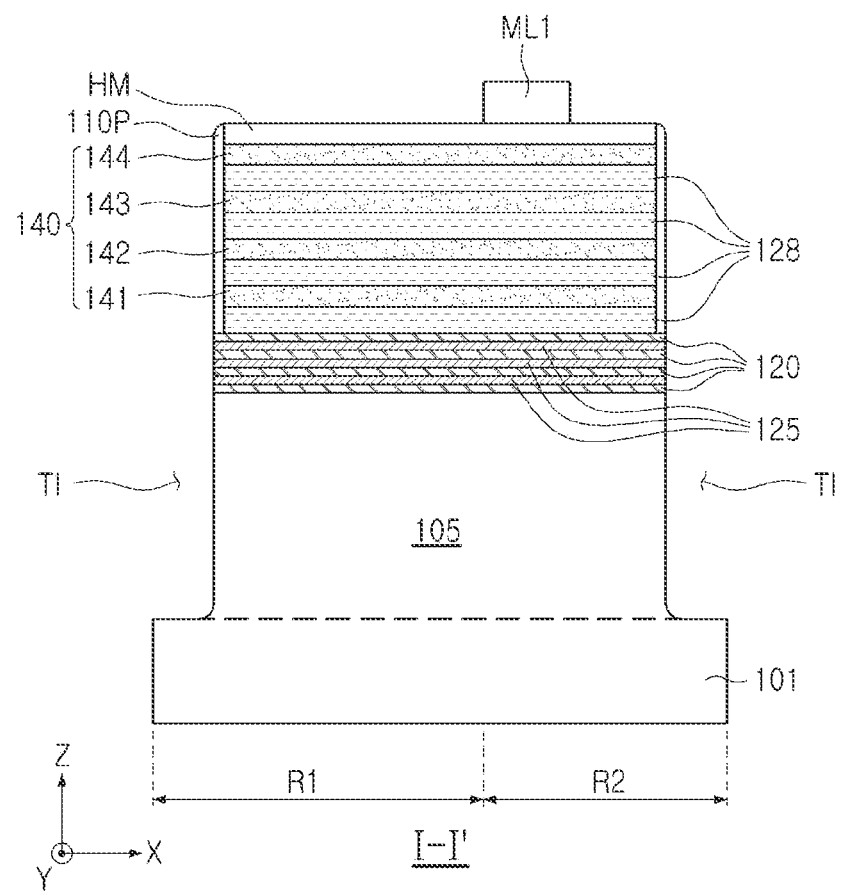
Figure 10C:
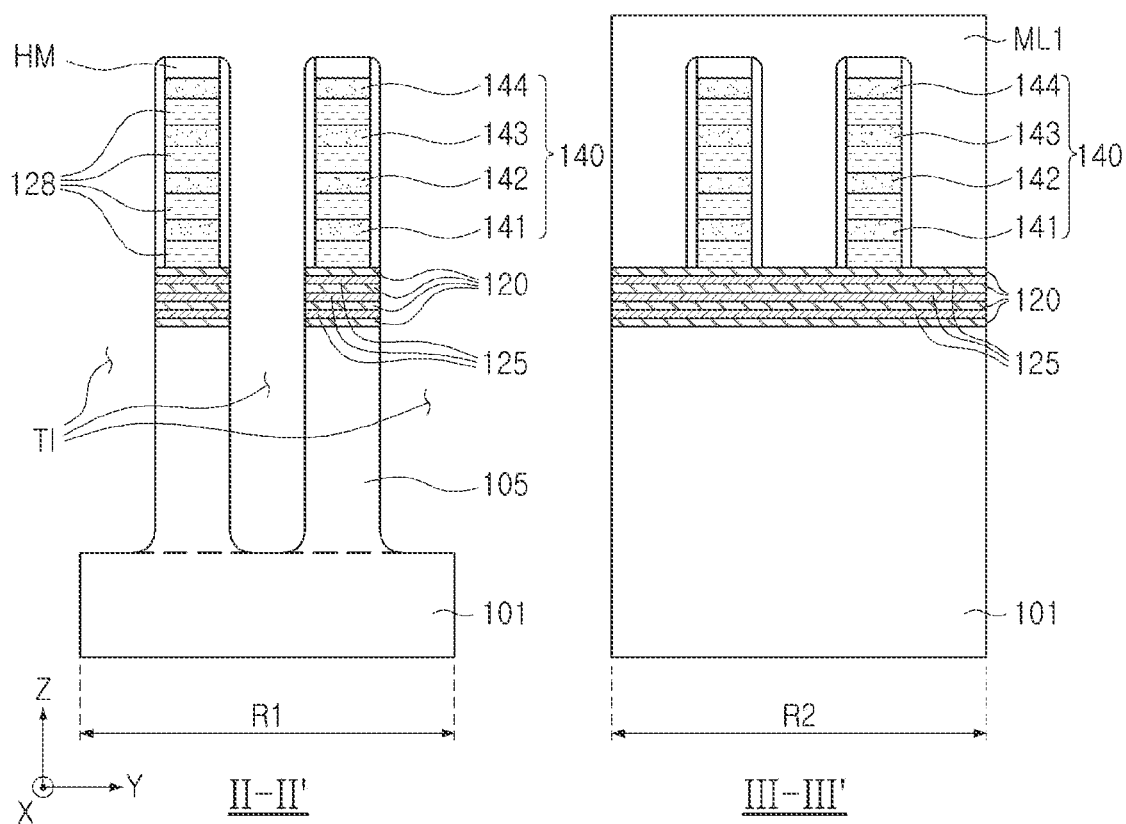

Referring to FIGS. 10A, 10B and 10C, a first mask layer ML1 may be formed, and a portion of the lower stack structure and a portion of the substrate 101 may be removed outside the hard mask layer HM and the preliminary liner layer 110P, to form trenches TI.

The first mask layer ML1 may be formed to cover at least a portion of the second region R2, for example, a region corresponding to the dummy gate structure 160D of FIGS. 1, 2A and 2B.

The trenches TI may be formed by removing a portion of the lower stack structure and a portion of the substrate 101 using the hard mask layer HM and the preliminary liner layer 110P as masks in a region exposed from the first mask layer ML1. By forming the trenches TI, active regions 105 of the substrate 101 may be defined in the first region R1 and a portion of the second region R2. In the second region R2, trench TI may not be formed in a region in which the first mask layer ML1 is formed.

Figure 11A:
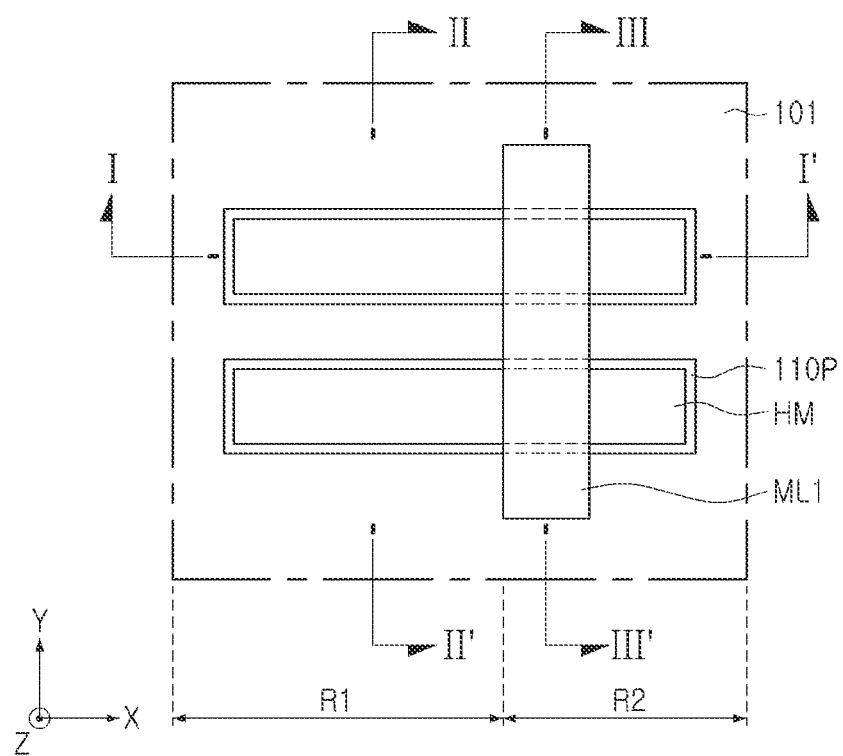
Figure 11B:
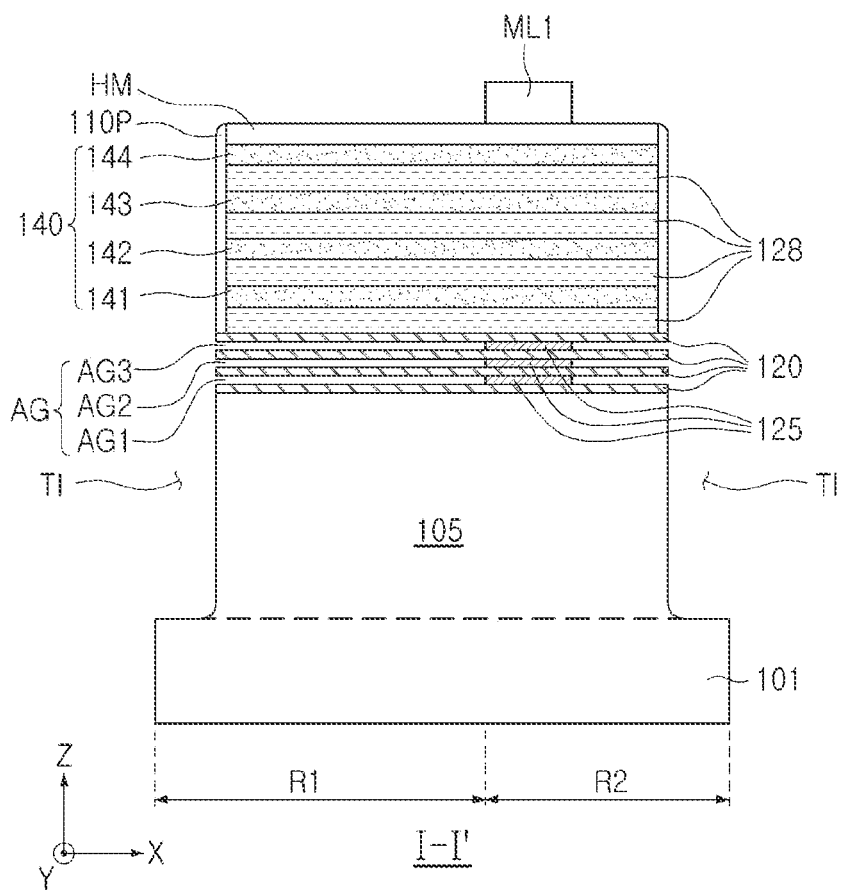
Figure 11C:
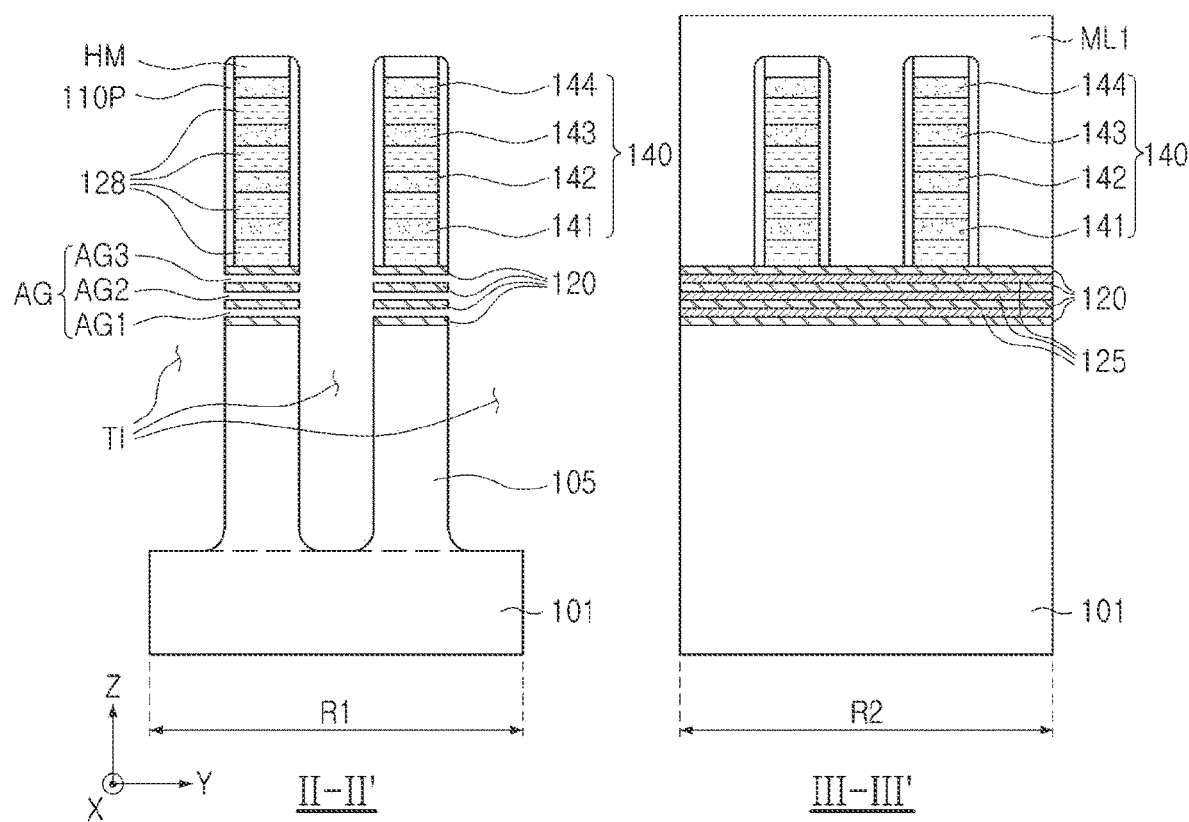

Referring to FIGS. 11A, 11B and 11C, a portion of the lower sacrificial layers 125 exposed through the trenches TI may be laterally removed to form air gap regions AG.

In the first region R1 and a portion of the second region R2, the lower sacrificial layers 125 may be selectively removed with respect to the active regions 105 and the semiconductor layers 120. A portion of the lower sacrificial layers 125 may be removed by, for example, a wet etching process. A region from which the lower sacrificial layers 125 are removed may be filled with air to form air gap regions AG. During the removal process, the upper stack structure may be protected by the preliminary liner layer 110P.

In the second region R2, trench TI may not be formed in a region in which the first mask layer ML1 is formed, such that at least a portion of the lower sacrificial layers 125 may remain. A length of the remaining portion of the lower sacrificial layers 125 in the X-direction may be variously changed, according to process conditions of the removal process.

Figure 12A:
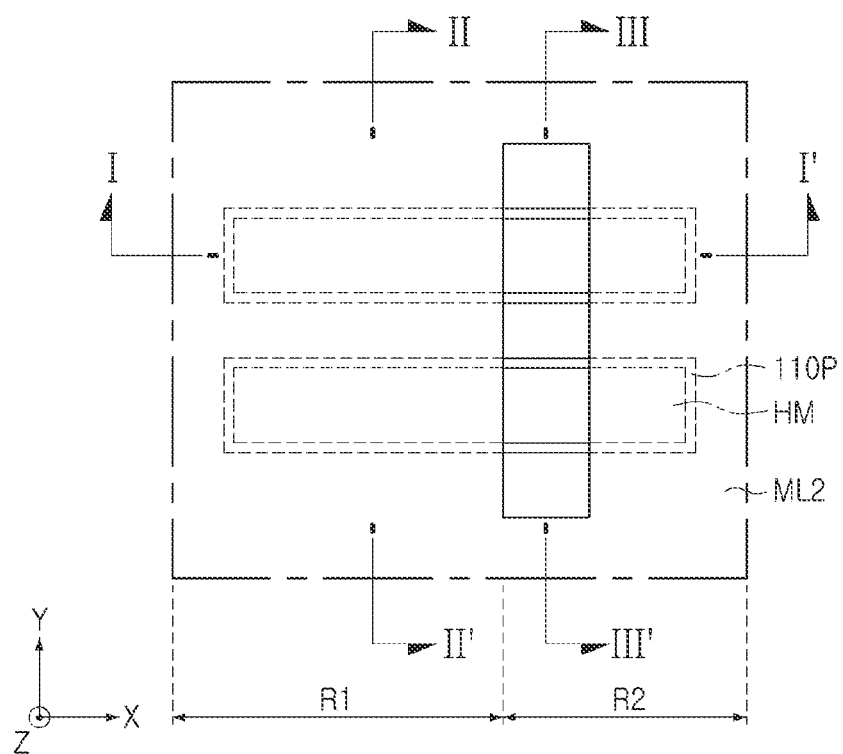
Figure 12B:
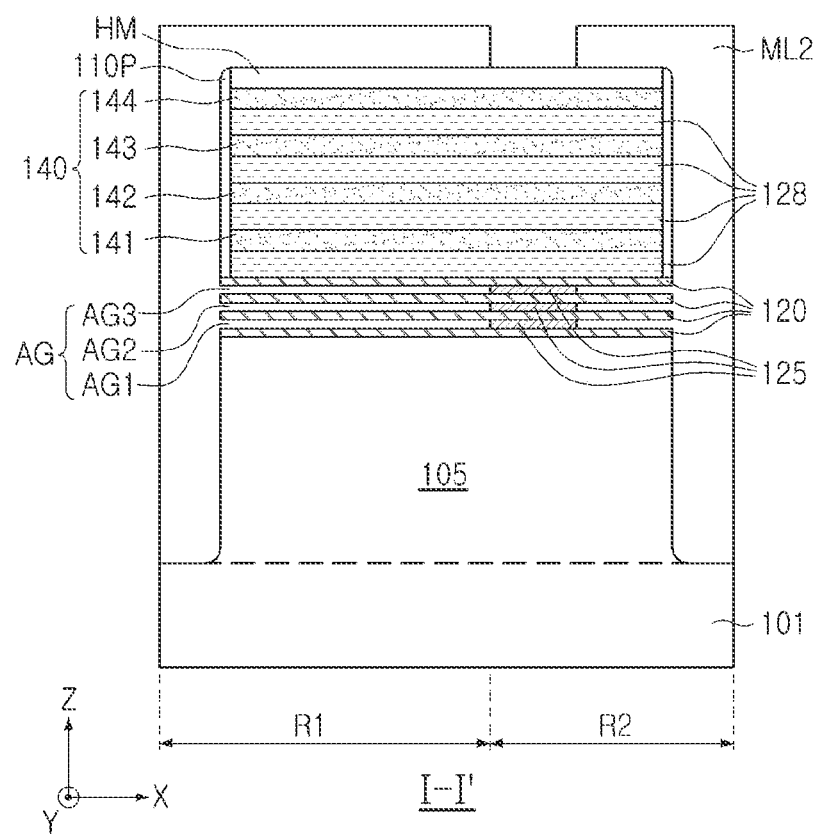
Figure 12C:
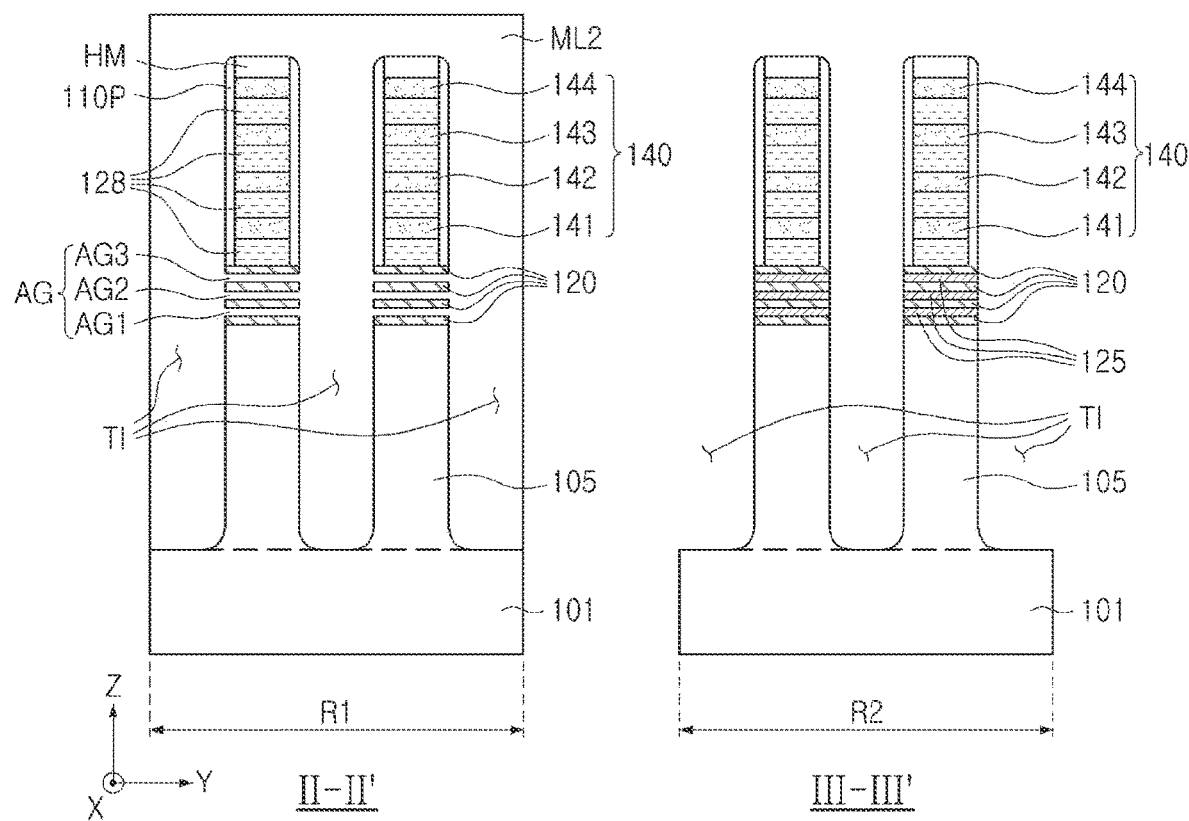

Referring to FIGS. 12A, 12B and 12C, a second mask layer ML2 may be formed, and a portion of the lower stack structure and a portion of the substrate 101 may be removed in a region exposed from the second mask layer ML2, to form trenches TI.

First, the first mask layer ML1 may be removed, and a second mask layer ML2 may be formed. The second mask layer ML2 may be formed to cover a region, except for a region where the first mask layer ML1 is formed.

As described above with reference to FIGS. 10A, 10B and 10C, the trenches TI may be formed by removing a portion of the lower stack structure and a portion of the substrate 101 using the hard mask layer HM and the preliminary liner layer 110P as masks, outside the second mask layer ML2. Therefore, active regions 105 may be also defined in the second region R2, as illustrated in FIG. 12C.

Figure 13A:
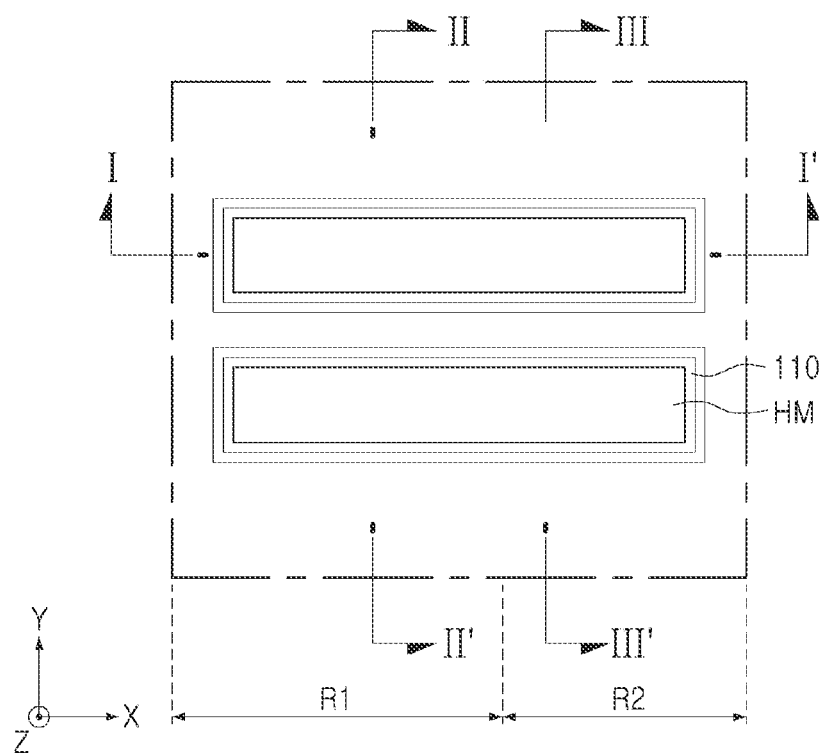
Figure 13B:
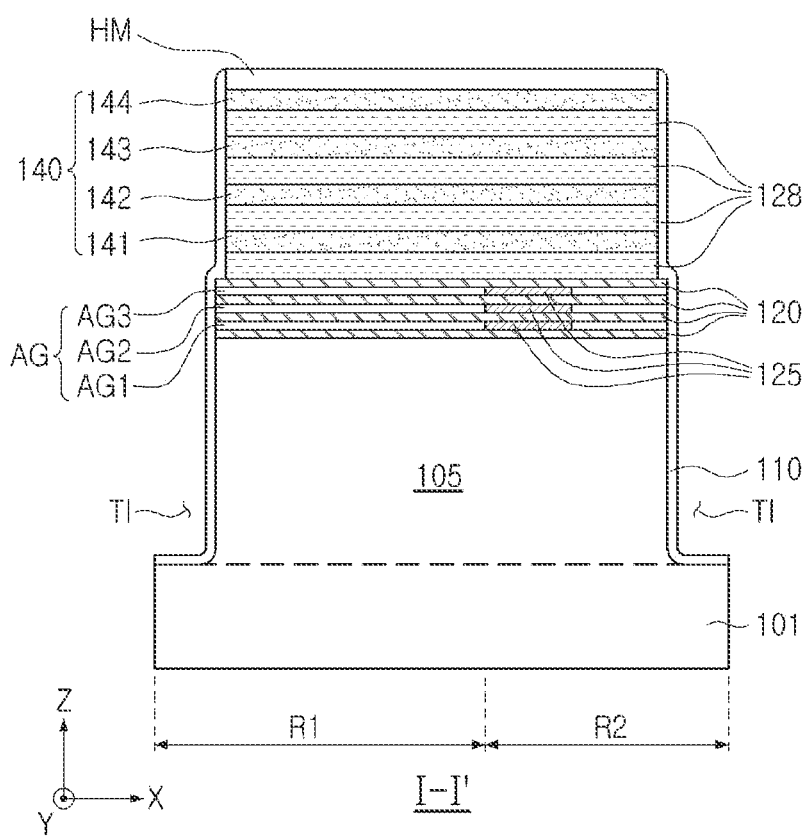
Figure 13C:
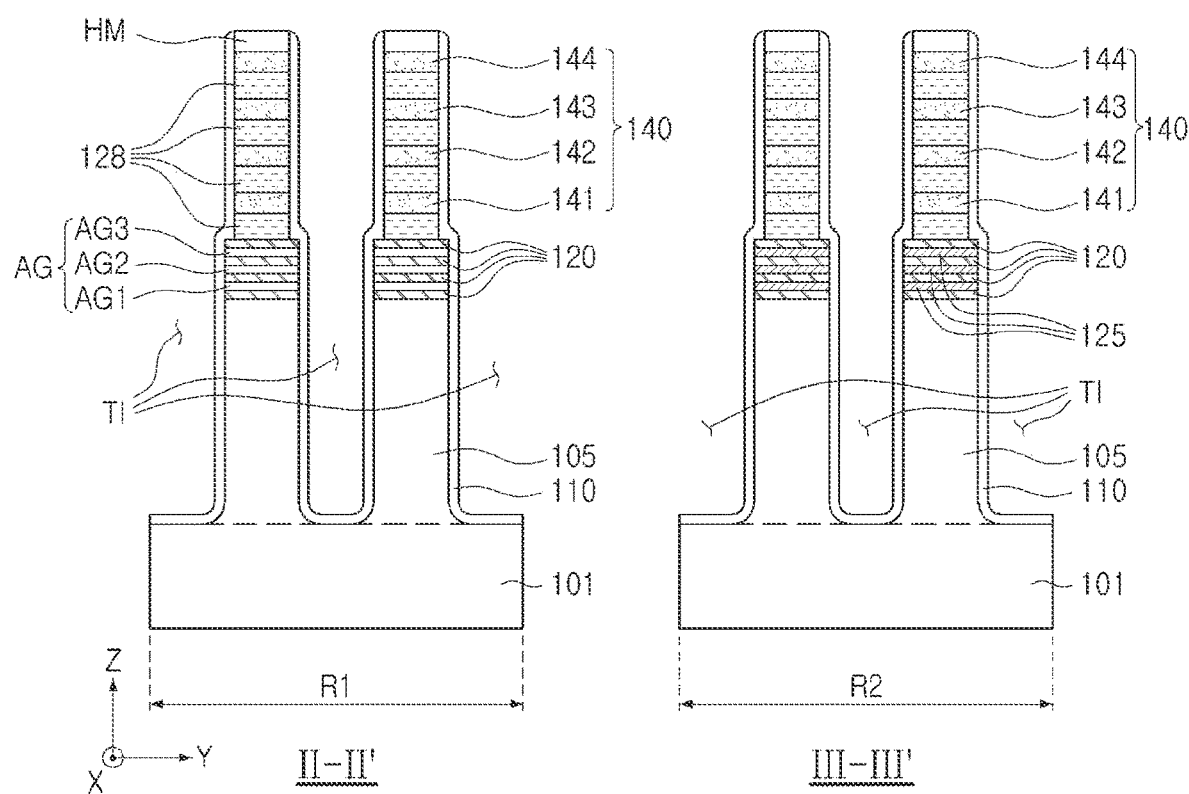

Referring to FIGS. 13A, 13B and 13C, the preliminary liner layer 110P may be removed and a liner layer 110 may be formed.

The preliminary liner layer 110P may be removed by, for example, a wet etching process. A liner layer 110 may be formed to cover side surfaces of the upper stack structure, side surfaces of the lower stack structure, and side surfaces of the active regions 105, and to cover inner side surfaces of the trenches TI. The liner layer 110 may be formed by a deposition process or an epitaxial process. The liner layer 110 may be partially removed from the side surfaces of the upper stack structure by a subsequent process.

Figure 14A:
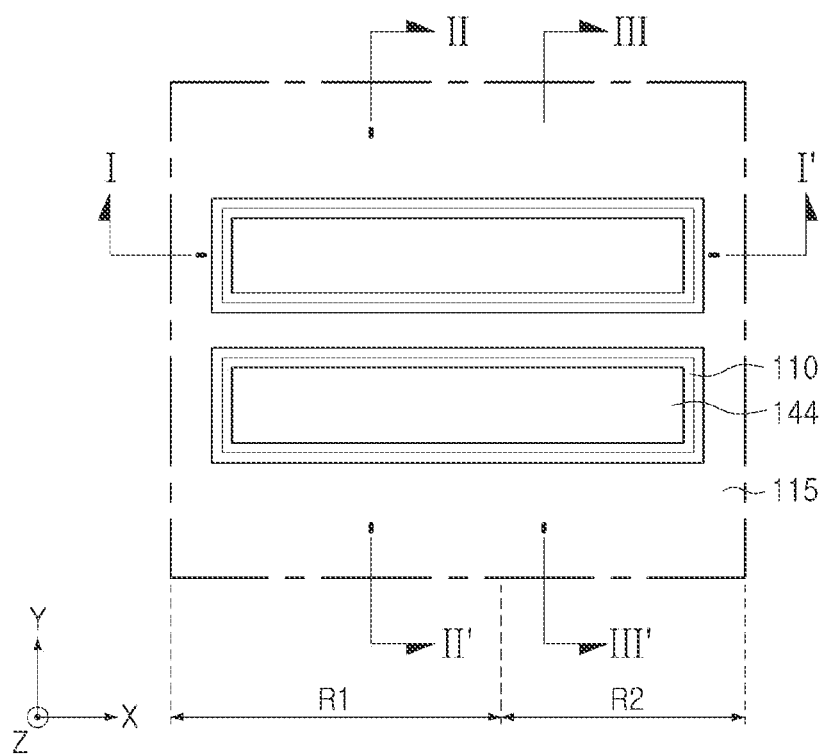
Figure 14B:
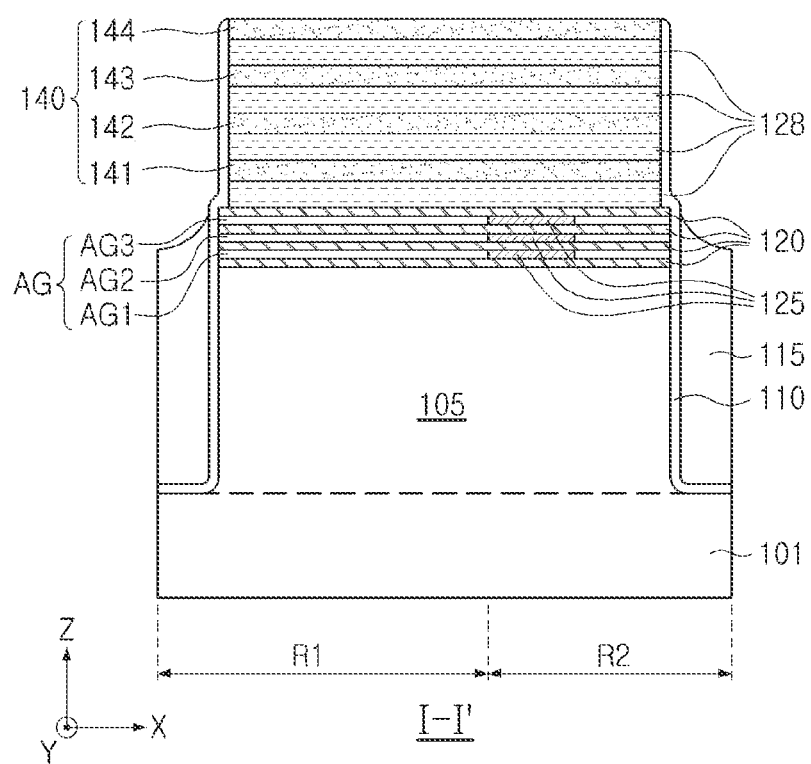
Figure 14C:
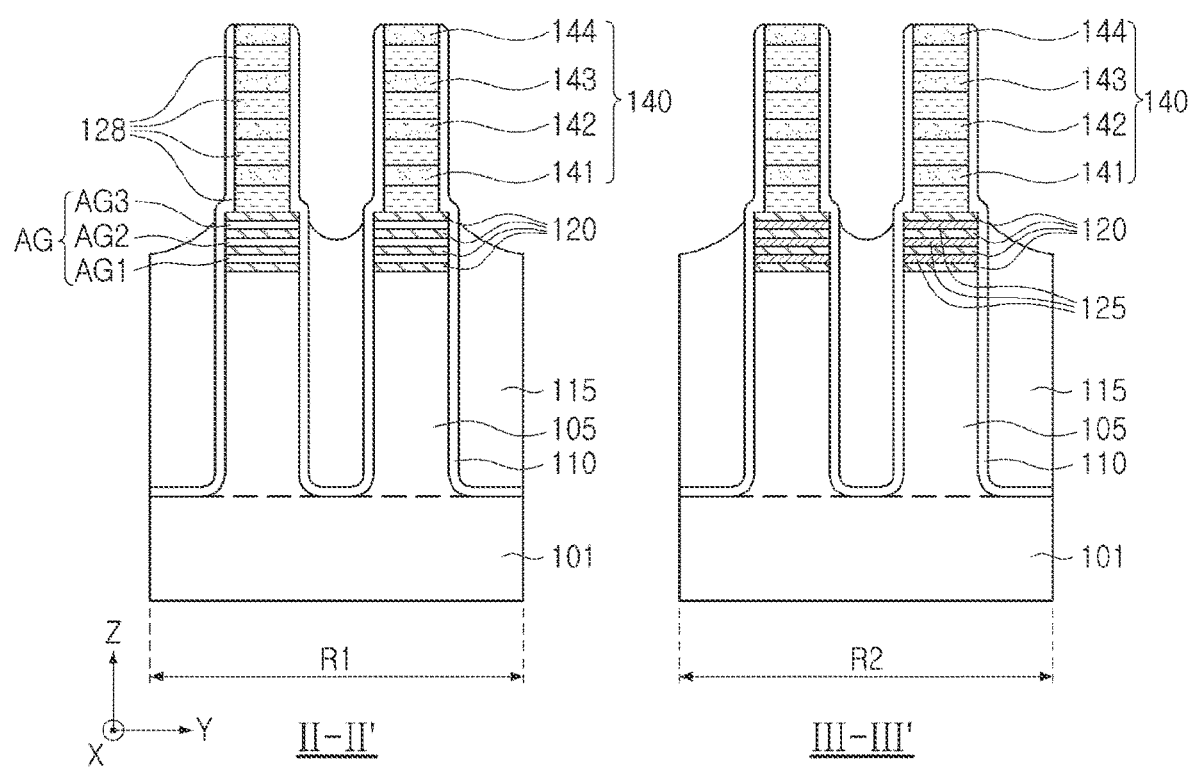

Referring to FIGS. 14A, 14B and 14C, a device isolation layer 115 filling the trenches TI may be formed.

First, an insulating material may be deposited to fill a space between the trenches TI and the upper stack structures, and a planarization process may be performed thereon. The planarization process may be, for example, a chemical mechanical polishing (CMP) process. During the planarization process, the hard mask layer HM may be removed.

Next, a device isolation layer 115 may be formed by partially removing the deposited insulating material from an upper surface of the deposited insulating material. A height and a profile of an upper surface of the device isolation layer 115 may be variously changed in embodiments. For example, the upper surface of the device isolation layer 115 may be located below the first channel layer 141, a lowermost channel layer.

Figure 15A:
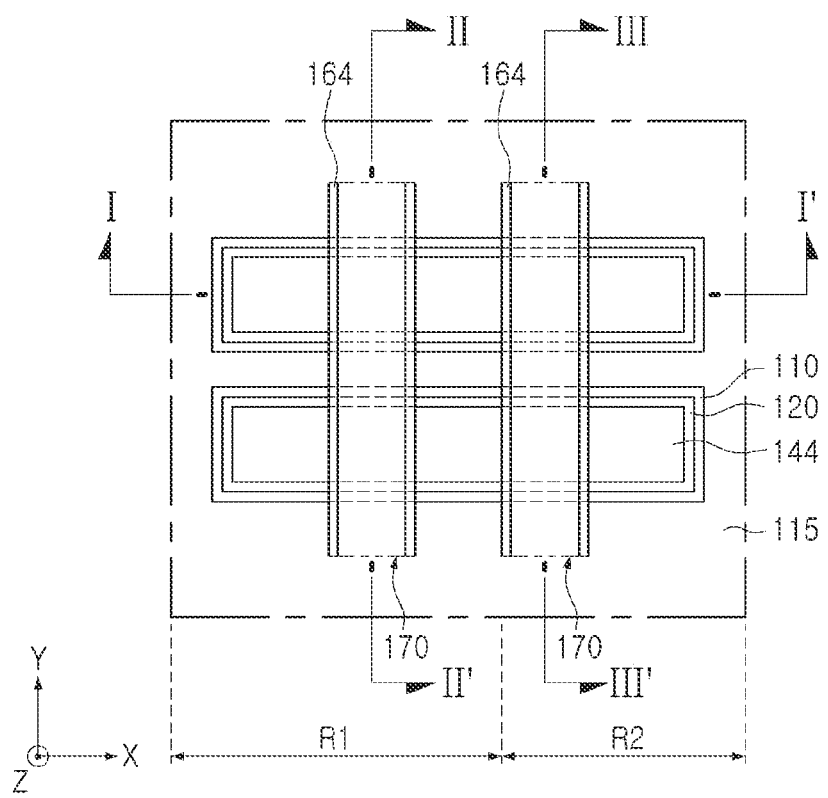
Figure 15B:
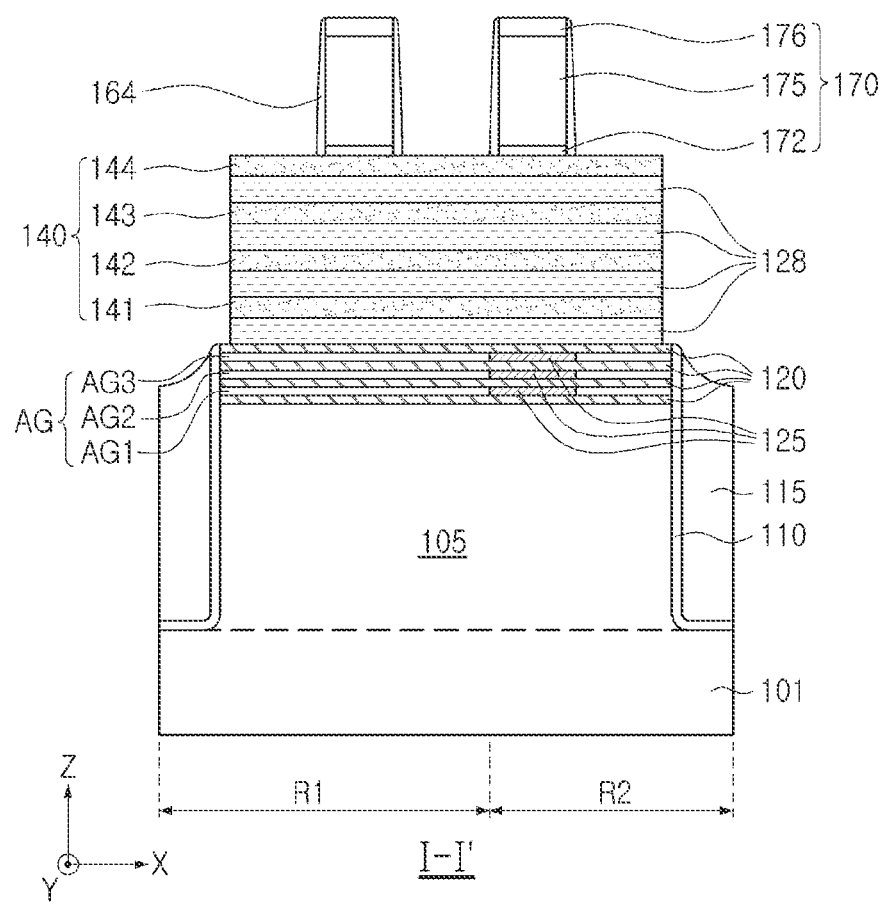
Figure 15C:
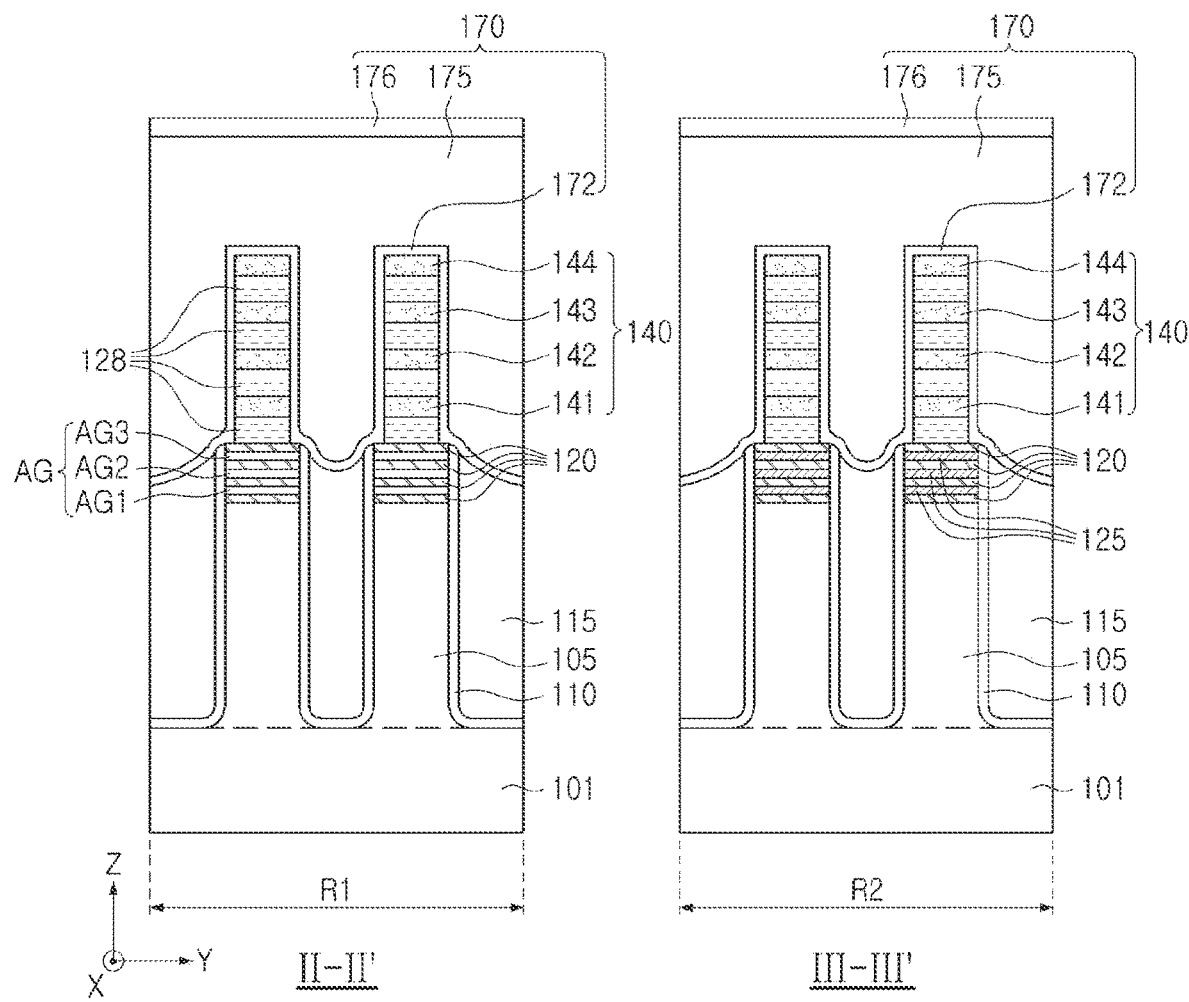

Referring to FIGS. 15A, 15B and 15C, sacrificial gate structures 170 and gate spacer layers 164 may be formed on the upper stack structure.

First, the liner layer 110 may be partially removed from side surfaces of the upper stack structure. For example, in the liner layer 110, a region exposed from the device isolation layer 115 may be selectively removed.

Next, sacrificial gate structures 170 may be sacrificial structures formed in a region in which a gate dielectric layer 162 and a gate electrode 165 are disposed on the channel structures 140, as illustrated in FIGS. 2A and 2B, by a subsequent process. The sacrificial gate structures 170 may include first and second sacrificial gate layers 172 and 175 and a mask pattern layer 176, sequentially stacked. The first and second sacrificial gate layers 172 and 175 may be patterned using a mask pattern layer 176. The first and second sacrificial gate layers 172 and 175 may be an insulating layer and a conductive layer, respectively, but are not limited thereto, and the first and second sacrificial gate layers 172 and 175 may be formed as a single layer. For example, the first sacrificial gate layer 172 may include silicon oxide, and the second sacrificial gate layer 175 may include polysilicon. The mask pattern layer 176 may include silicon oxide and/or silicon nitride. The sacrificial gate structures 170 may have a linear shape intersecting the active regions 105, and extending in one direction, for example, the Y-direction. The sacrificial gate structures 170 may be disposed to be spaced apart from each other in the X-direction.

Gate spacer layers 164 may be formed on both sidewalls of the sacrificial gate structures 170. The gate spacer layers 164 may be formed of a low-k material, and may include, for example, at least one of SiO, SiN, SiCN, SiOC, SiON, or SiOCN.

Figure 16A:
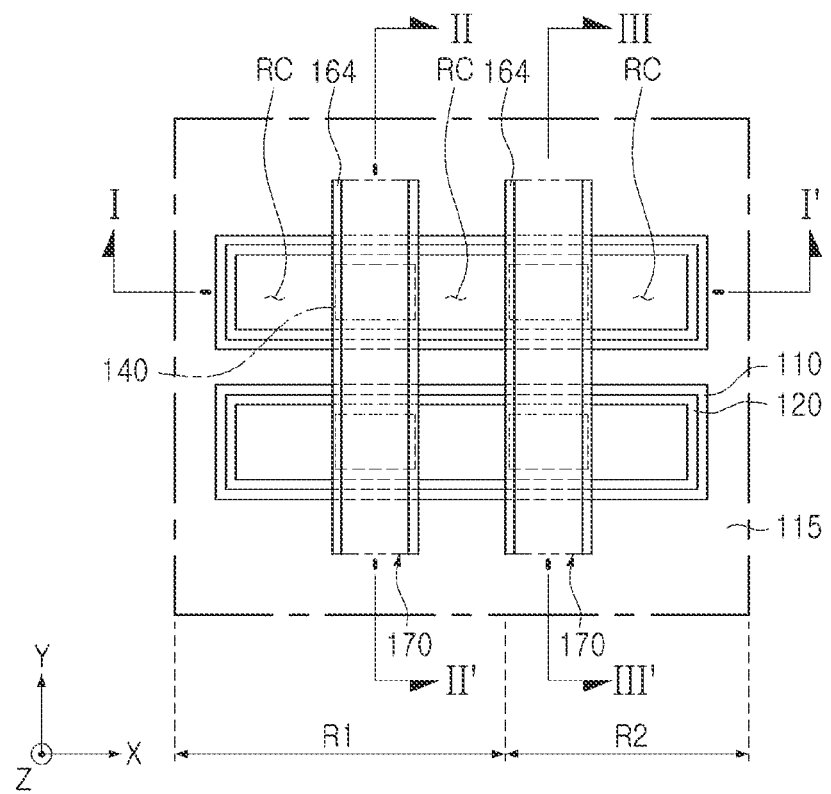
Figure 16B:
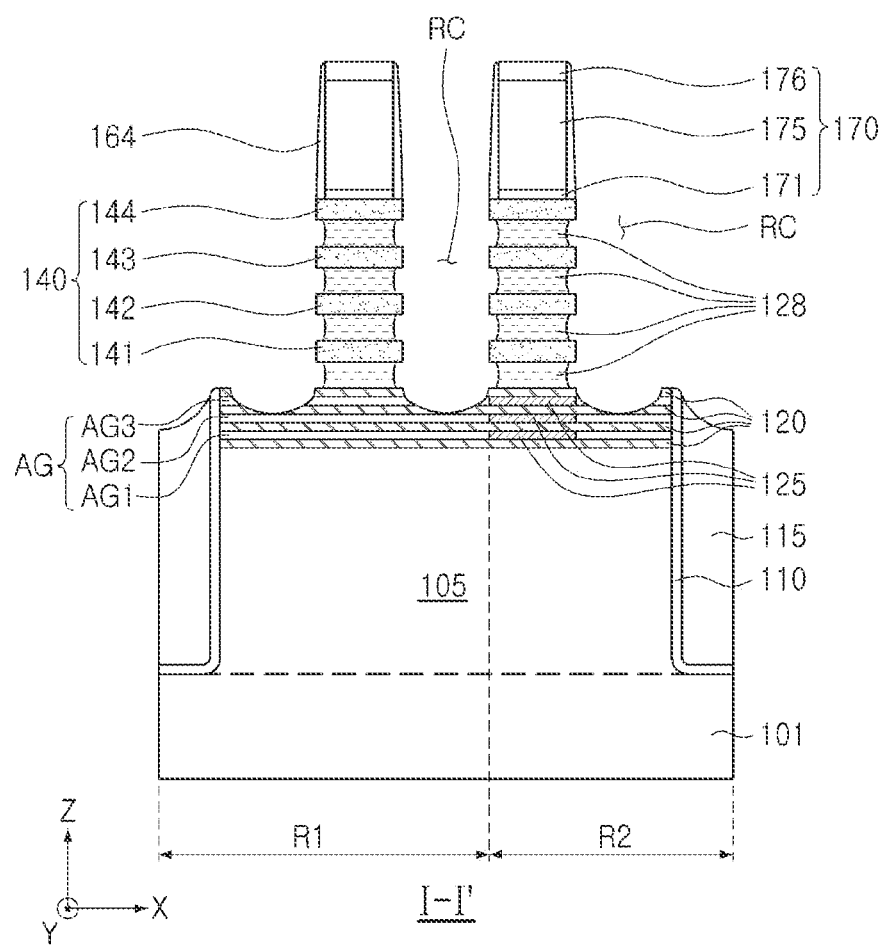
Figure 16C:
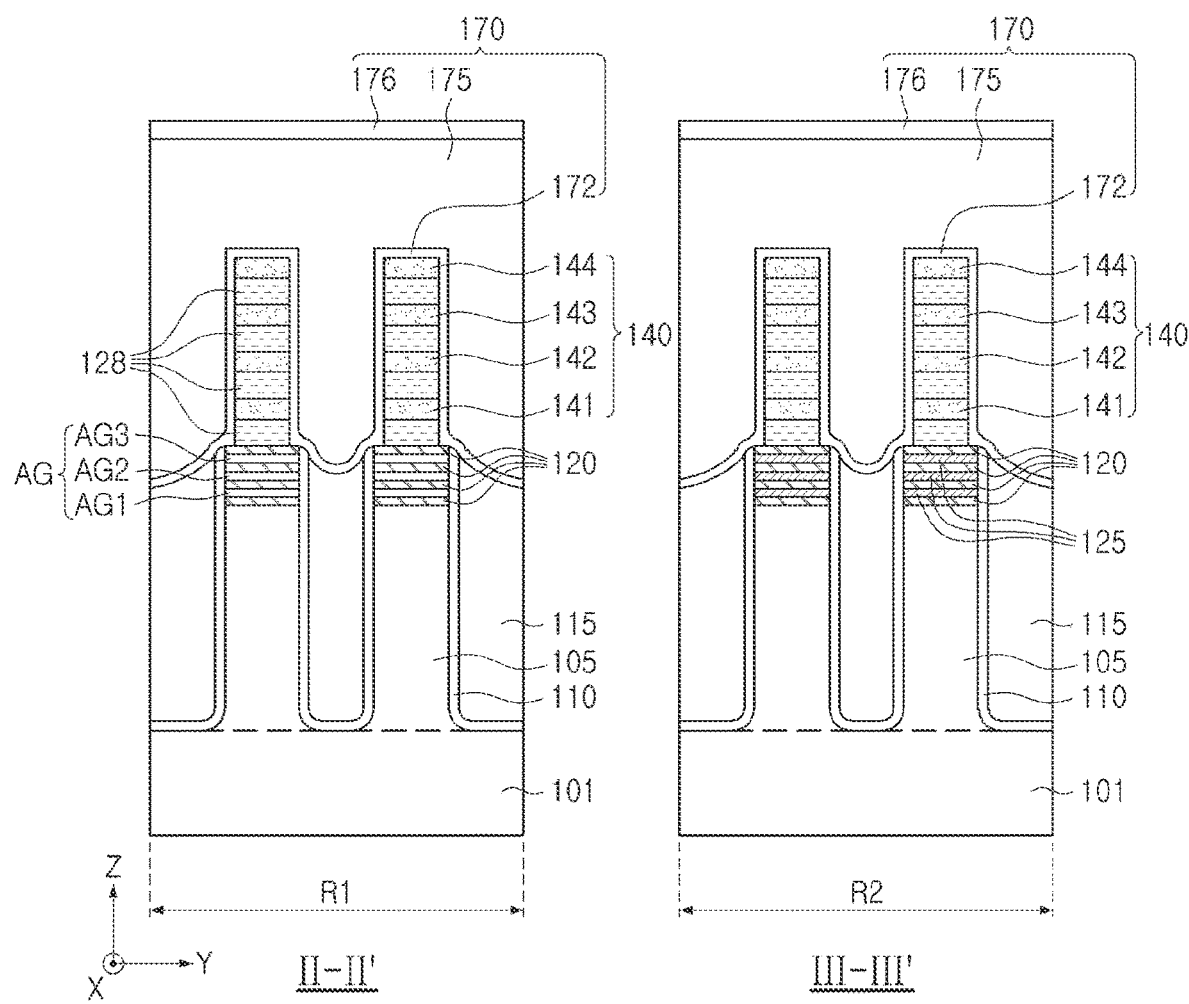

Referring to FIGS. 16A, 16B and 16C, an exposed portion of the upper stack structure and the lower stack structure may be removed from both sides of the sacrificial gate structures 170, to form recess regions RC, and an exposed portion of the upper sacrificial layer 128 may be partially removed laterally.

First, an exposed portion of the upper stack structure and the lower stack structure may be removed using the sacrificial gate structures 170 and the gate spacer layer 164 as masks, to form recess regions RC. Therefore, the channel structure 140 may have a limited length in the X-direction. The recess regions RC may be formed to pass through at least the third air gap region AG3 as an uppermost third air gap region. In some embodiments, when the recess regions RC are formed, the semiconductor layer 120 below the third air gap region AG3 may be used as an etch stop layer.

Next, the upper sacrificial layers 128 exposed through the recess regions RC may be selectively etched with respect to the channel structures 140 by, for example, a wet etching process, to be removed to a predetermined depth from the side surfaces thereof in the X-direction. The upper sacrificial layers 128 may have inwardly concave side surfaces by lateral etching, as described above. Shapes of the side surfaces of the upper sacrificial layers 128 are not limited to those illustrated.

Figure 17A:
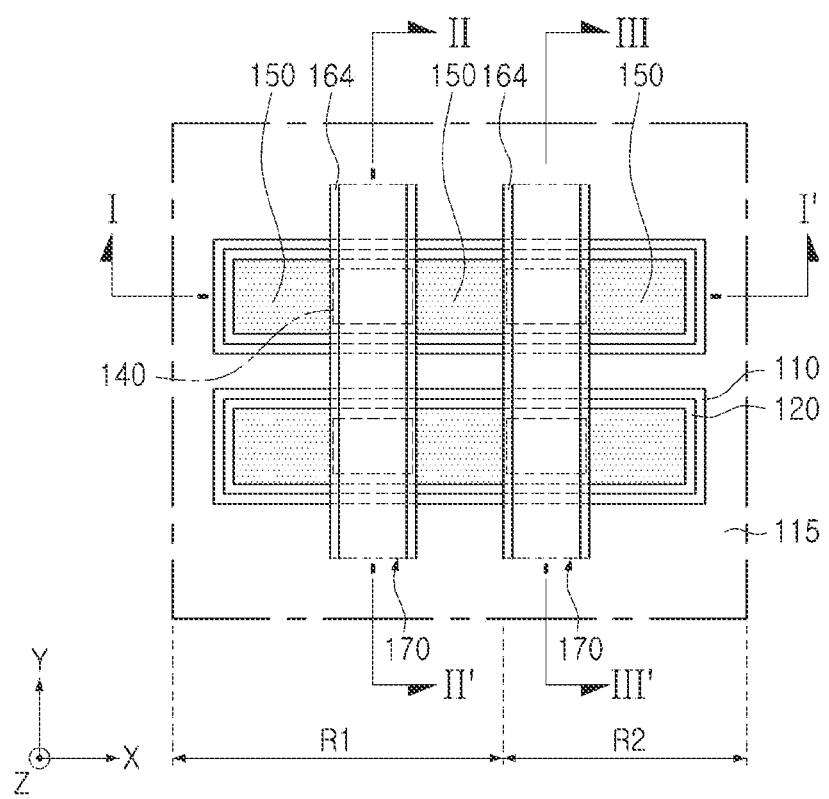
Figure 17B:
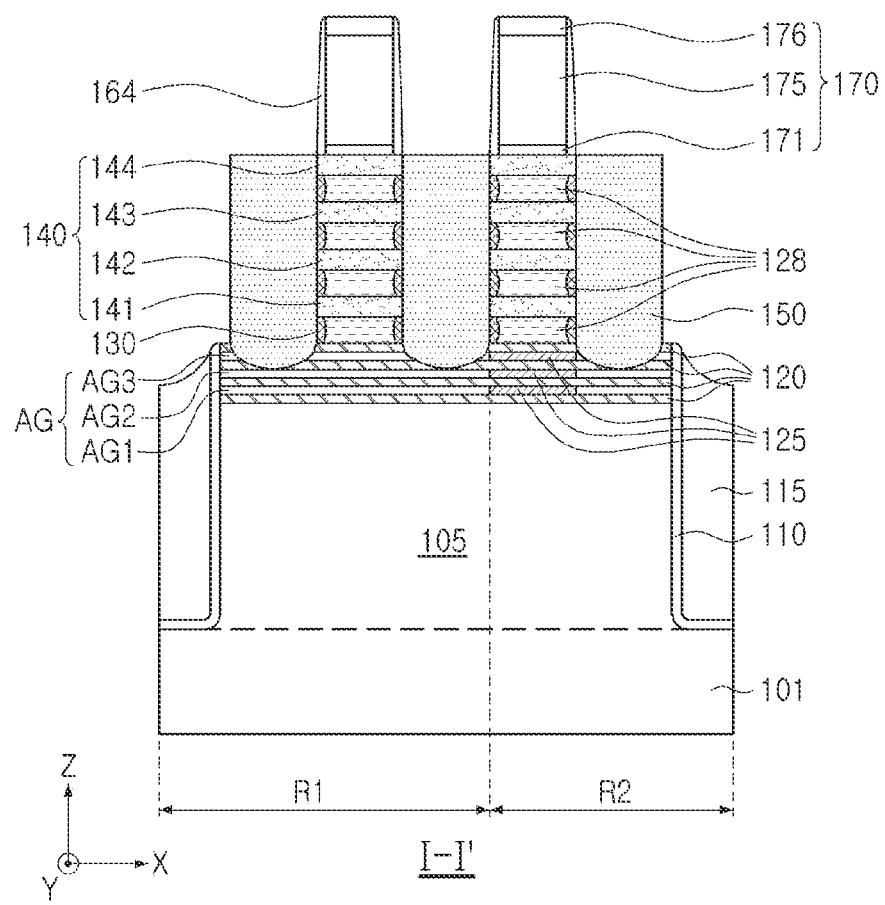
Figure 17C:
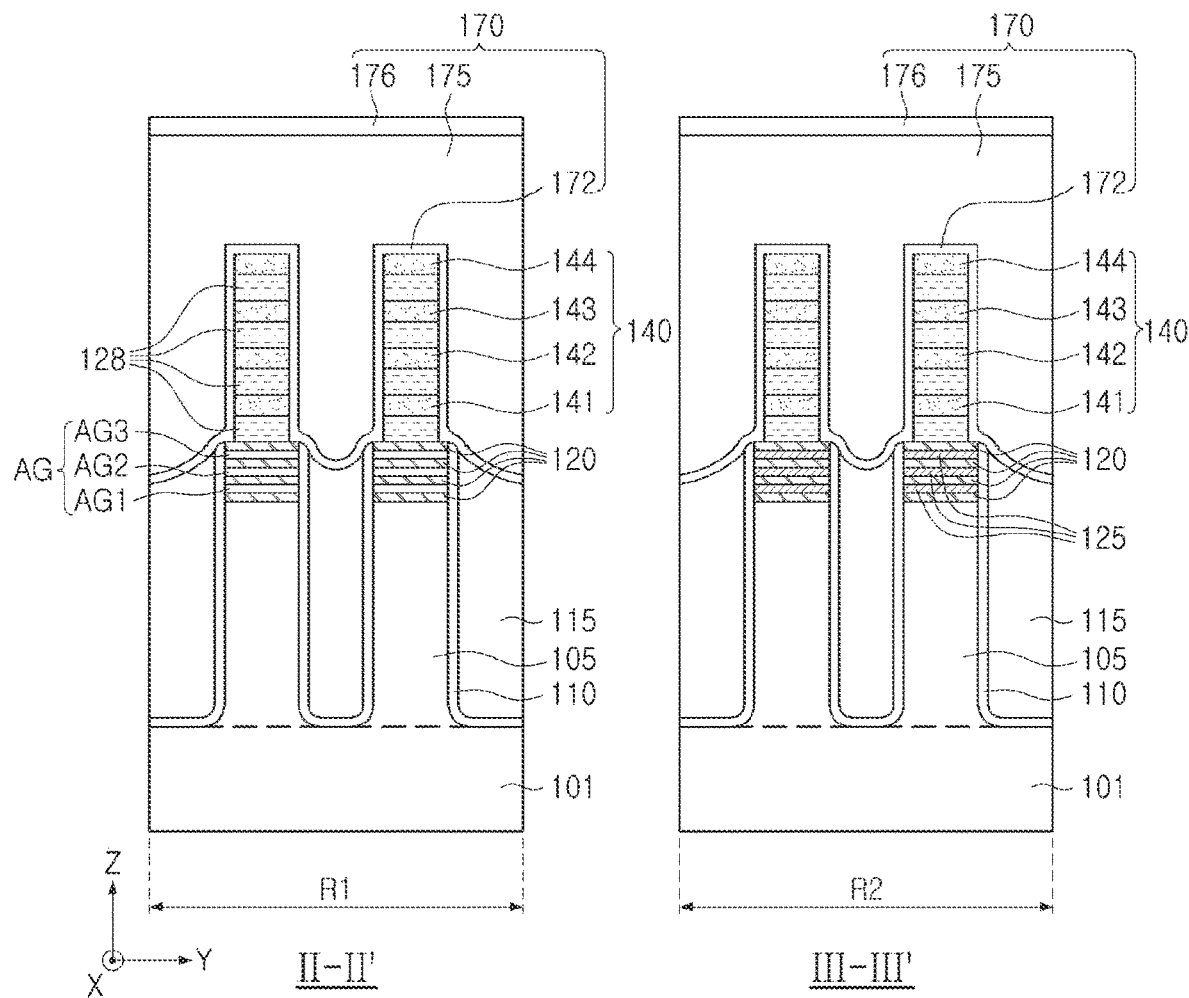

Referring to FIGS. 17A, 17B and 17C, internal spacer layers 130 may be formed, and source/drain regions 150 filling the recess regions RC may be formed.

First, internal spacer layers 130 may be formed in a region from which the upper sacrificial layers 128 are removed. The internal spacer layers 130 may be formed by filling an insulating material in a region from which the upper sacrificial layers 128 are removed and removing the insulating material deposited in a peripheral portion of the channel structures 140. The internal spacer layers 130 may be formed of the same material as the gate spacer layers 164, but is not limited thereto. For example, the internal spacer layers 130 may include at least one of SiN, SiCN, SiOCN, SiBCN, or SiBN.

Next, source/drain regions 150 may be formed by growing from side surfaces of the channel structures 140 and exposed surfaces of the semiconductor layer 120 by a selective epitaxial growth process. The source/drain regions 150 may include impurities by in-situ doping, and may include a plurality of layers having different doping elements and/or doping concentrations.

Figure 18A:
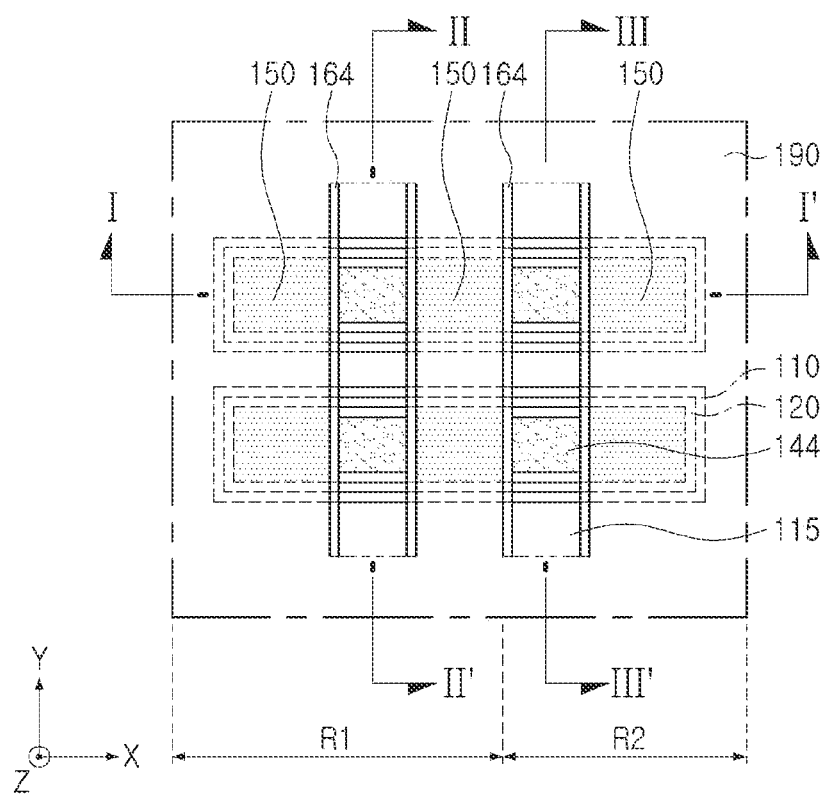
Figure 18B:
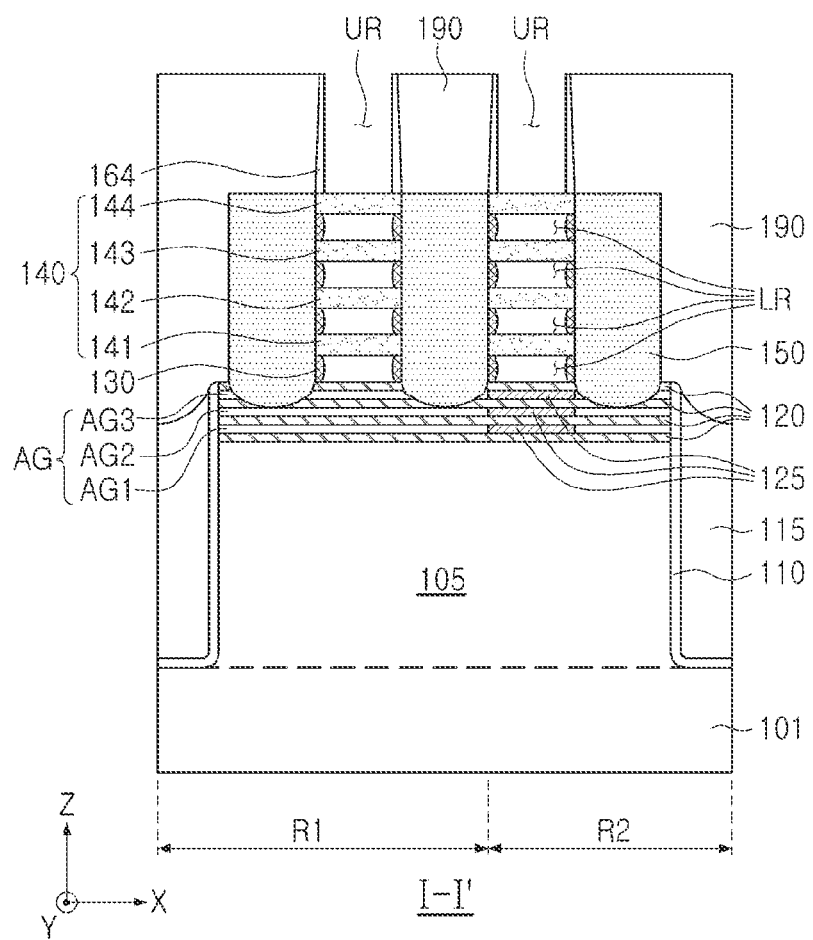
Figure 18C:
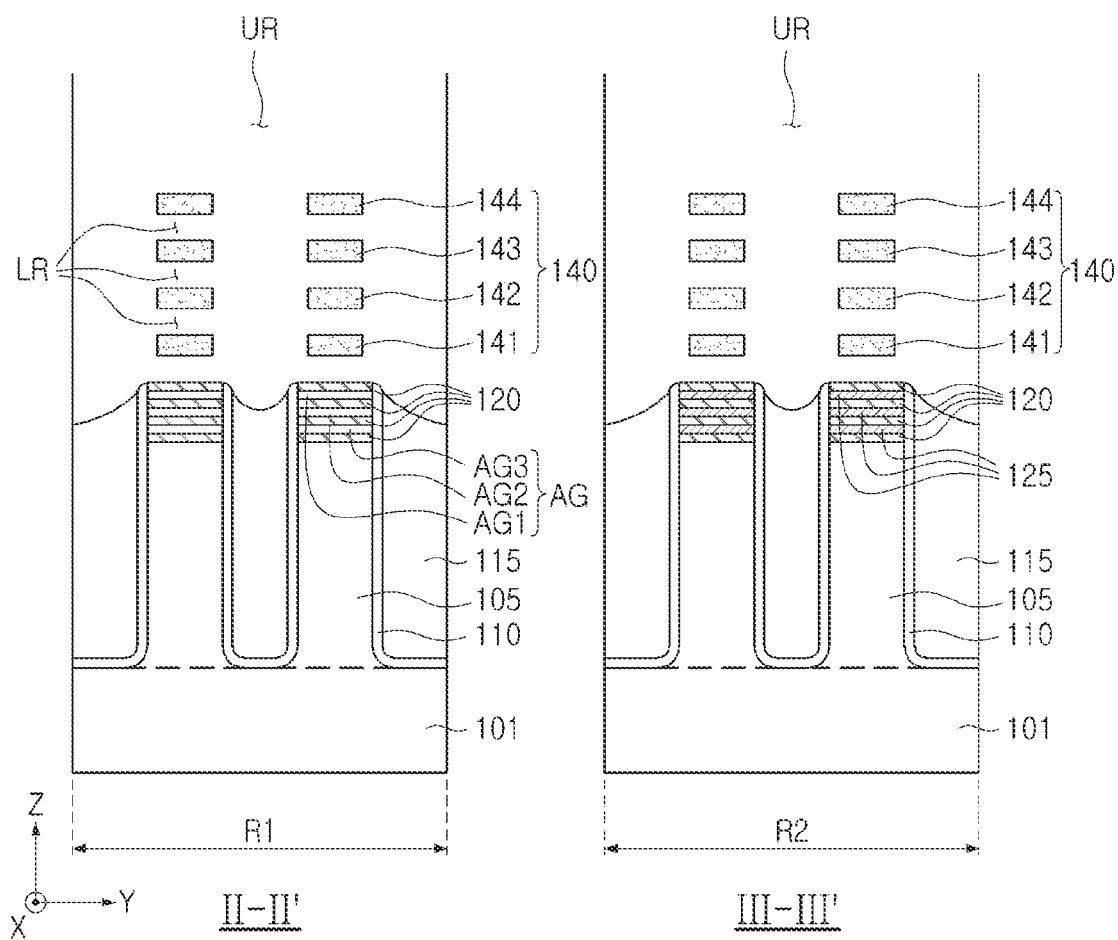

Referring to FIGS. 18A, 18B and 18C, an interlayer insulating layer 190 may be formed, and the upper sacrificial layers 128 and the sacrificial gate structures 170 may be removed.

The interlayer insulating layer 190 may be formed by forming an insulating layer covering the sacrificial gate structures 170 and the source/drain regions 150, and subjecting the insulating layer to one or more planarization process(es).

The upper sacrificial layers 128 and the sacrificial gate structures 170 may be selectively removed with respect to the gate spacer layers 164, the interlayer insulating layer 190, the channel structures 140, and the semiconductor layers 120. First, upper gap regions UR may be formed by removing the sacrificial gate structures 170, and lower gap regions LR may be then formed by removing the upper sacrificial layers 128 exposed through the upper gap regions UR. For example, when the upper sacrificial layers 128 include silicon germanium (SiGe) and the channel structures 140 include silicon (Si), the upper sacrificial layers 128 may be selectively removed by performing a wet etching process using peracetic acid as an etchant. During the removal process, the source/drain regions 150 may be protected by the interlayer insulating layer 190 and the internal spacer layers 130.

Figure 19A:
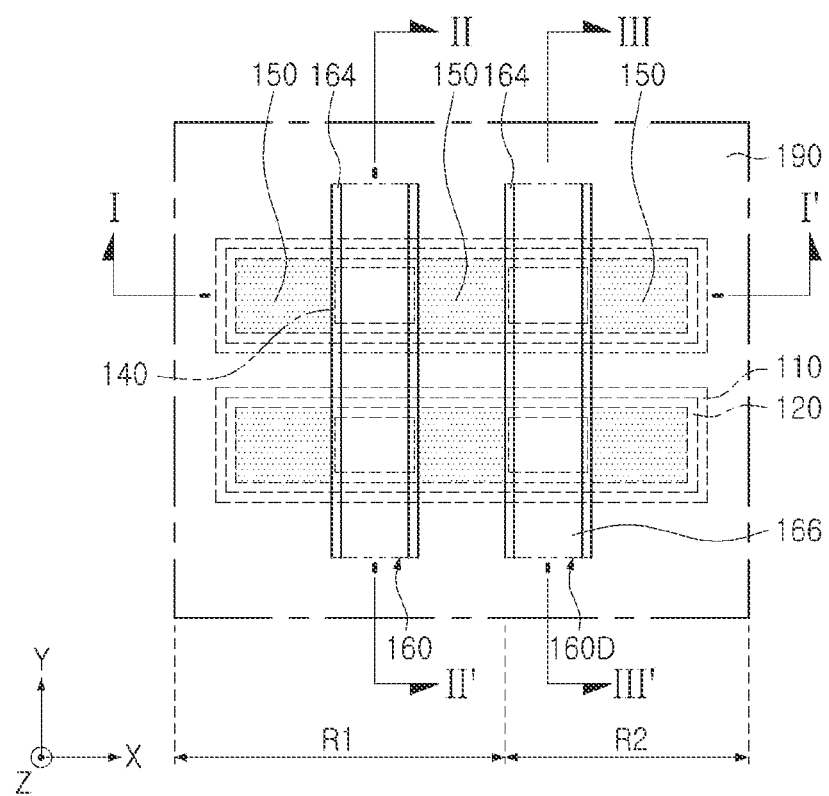
Figure 19B:
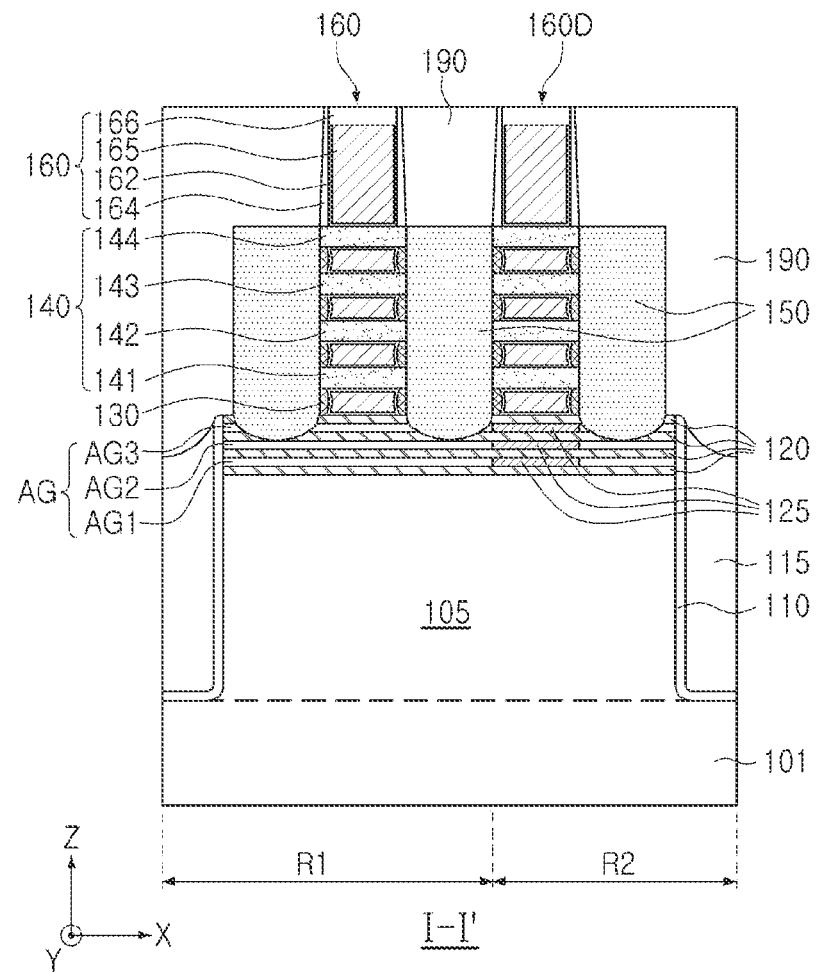
Figure 19C:
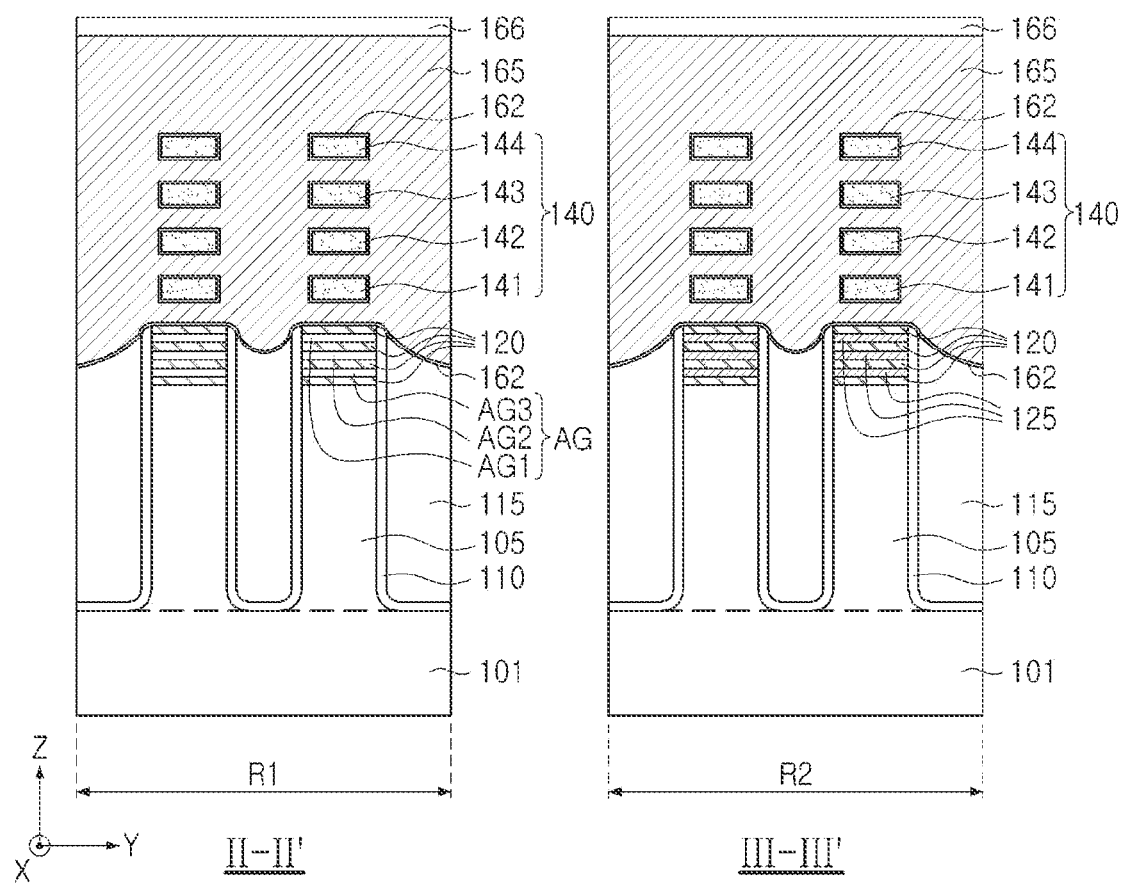

Referring to FIGS. 19A, 19B and 19C, a gate structure 160 and a dummy gate structure 160D may be formed.

The gate structure 160 and the dummy gate structure 160D may be formed to fill the upper gap regions UR and the lower gap regions LR. Gate dielectric layers 162 may be formed to conformally cover inner surfaces of the upper gap regions UR and inner surfaces of the lower gap regions LR. A gate electrode 165 may be formed to completely fill the upper gap regions UR and the lower gap regions LR, and may be then removed from an upper portion in the upper gap regions UR to a certain depth, together with the gate dielectric layers 162 and the gate spacer layers 164. A gate capping layer 166 may be formed in a region from which the gate electrode 165 is removed. Therefore, the gate structure 160 and the dummy gate structure 160D respectively including the gate dielectric layer 162, the gate electrode 165, the gate spacer layers 164, and the gate capping layer 166 may be formed.

Next, referring collectively to FIGS. 2A and 2B, contact plugs 180 may be formed.

First, the interlayer insulating layer 190 may be patterned to form contact holes, and contact plugs 180 may be formed by filling the contact holes with a conductive material. Specifically, after depositing a material constituting a barrier layer in the contact holes, a silicide process may be performed to form a metal-semiconductor compound layer such as a silicide layer on a lower end. Next, a conductive material may be deposited to fill the contact holes.

Lower surfaces of the contact holes may be recessed into the source/drain regions 150 or may have a curve along upper surfaces of the source/drain regions 150. In embodiments, shapes and arrangement of the contact plugs 180 may be variously changed.

By including a multi-air gap region, a semiconductor device exhibiting improved electrical characteristics and greater performance reliability may be achieved.

Various advantages and effects of the inventive concept are not limited to those explicitly described above, but may be understood in the context of the illustrated teaching examples of the inventive concept.

While certain embodiments have been illustrated and described, it will be apparent to those skilled in the art that various modifications and variations may be made without departing from the scope of the inventive concept as defined by the appended claims.

What is claimed is:

1. A semiconductor device comprising:
a substrate including an active region extending in a first direction;
a gate structure disposed on the substrate, intersecting the active region, and extending in a second direction;
a plurality of channel layers disposed on the active region and spaced apart in a third direction perpendicular to an upper surface of the substrate, wherein the plurality of channel layers are surrounded by the gate structure;
source/drain regions disposed on opposing sides of the gate structure and connected to the plurality of channel layers;
air gap regions disposed between the source/drain regions and the active region and spaced apart in the third direction; and
semiconductor layers below a lowermost channel layer of the plurality of channel layers and alternately disposed with the air gap regions in the third direction to define the air gap regions,
wherein lower ends of the source/drain regions are located at a level lower than an uppermost air gap region among the air gap regions.

2. The semiconductor device of claim 1, wherein the source/drain regions pass through at least the uppermost air gap region.

3. The semiconductor device of claim 1, wherein the lower ends of the source/drain regions are disposed at a higher level than a lowermost air gap region among the air gap regions.

4. The semiconductor device of claim 1, wherein the air gap regions extend between the gate structure and the active region.

5. The semiconductor device of claim 1, further comprising:
lower sacrificial layers disposed below the plurality of channel layers and the gate structure to at least partially fill at least one of the air gap regions.

6. The semiconductor device of claim 5, wherein the lower sacrificial layers have a second length less than a first length for each channel layer of the plurality of channel layers in the first direction.

7. The semiconductor device of claim 5, wherein the lower sacrificial layers are epitaxial layers including a semiconductor material different from a semiconductor material of the semiconductor layers.

8. The semiconductor device of claim 1, wherein a height for each of the air gap regions is about 1.0 nm to about 10 nm.

9. The semiconductor device of claim 1, further comprising:
a liner layer, together with the semiconductor layers, defining the air gap regions,
wherein the liner layer covers side surfaces of the semiconductor layers and side surfaces of the air gap regions.

10. The semiconductor device of claim 9, further comprising:
a device isolation layer defining the active region and including an insulating material,
wherein the liner layer extends along an interface between the device isolation layer and the active region.

11. The semiconductor device of claim 1, further comprising:
a support region spaced apart from the source/drain regions in the first direction and including lower sacrificial layers disposed between the semiconductor layers.

12. The semiconductor device of claim 11, wherein the support region includes a region omitting the air gap regions.

13. The semiconductor device of claim 1, wherein the air gap regions includes at least three air gap regions arranged in the third direction.

14. The semiconductor device of claim 1, further comprising:
internal spacer layers disposed between the gate structure and the source/drain regions in the first direction.

* * * * *